(12) United States Patent  
Erchak et al.

(10) Patent No.: US 7,196,354 B1  
(45) Date of Patent: Mar. 27, 2007

(54) WAVELENGTH-CONVERTING LIGHT-EMITTING DEVICES

(75) Inventors: Alexei A. Erchak, Cambridge, MA (US); Michael Lim, Cambridge, MA (US); Elefterios Lidorikis, Newton, MA (US); Jo A. Venezia, Boston, MA (US); Michael G. Brown, Tyngsboro, MA (US); Robert F. Karlicek, Jr., Chelmsford, MA (US)

(73) Assignee: Luminus Devices, Inc., Woburn, MA (US)

( * ) Notice: Subject to any disclaimer, the term of this patent is extended or adjusted under 35 U.S.C. 154(b) by 25 days.

(21) Appl. No.: 11/238,667

(22) Filed: Sep. 29, 2005

(51) Int. Cl.  
 *H01L 27/15* (2006.01)  
 *H01L 21/00* (2006.01)

(52) U.S. Cl. .......................................... 257/79; 257/98

(58) Field of Classification Search ................ 257/79, 257/98, 99, 712; 438/29  
See application file for complete search history.

(56) References Cited

U.S. PATENT DOCUMENTS

| | | |
|---|---|---|
| 4,729,076 A | 3/1988 | Masami |
| 5,113,232 A | 5/1992 | Itoh |
| 6,045,240 A | 4/2000 | Hochstein |
| 6,265,820 B1 | 7/2001 | Ghosh et al. |
| 6,335,548 B1 | 1/2002 | Roberts |
| 6,340,824 B1 | 1/2002 | Komoto |
| 6,375,340 B1 | 4/2002 | Biebl |
| 6,388,264 B1 | 5/2002 | Pace |
| 6,410,940 B1 | 6/2002 | Jiang |
| 6,450,664 B1 | 9/2002 | Kelly |
| 6,452,217 B1 | 9/2002 | Wojnarowski |
| 6,475,819 B2 | 11/2002 | Franz |
| 6,476,549 B2 | 11/2002 | Yu |
| 6,480,389 B1 | 11/2002 | Shie |
| 6,481,874 B2 | 11/2002 | Petroski |
| 6,501,103 B1 | 12/2002 | Jory |
| 6,504,180 B1 | 1/2003 | Heremans |
| 6,504,181 B2 | 1/2003 | Furukawa |
| 6,518,600 B1 | 2/2003 | Shaddock |
| 6,608,332 B2 | 8/2003 | Shimizu |
| 6,624,491 B2 | 9/2003 | Waitl |
| 6,627,521 B2 | 9/2003 | Furukawa |
| 6,642,618 B2 | 11/2003 | Yagi |
| 6,690,268 B2 | 2/2004 | Schofield |
| 6,759,723 B2 | 7/2004 | Silverbrook |
| 6,791,259 B1 | 9/2004 | Stokes |

(Continued)

OTHER PUBLICATIONS

"NeoPac sets new standard with 500 lumen LED lighting", LEDs Magazine, http://www.ledsmagazine.com/press/9495, Date announced Jul. 5, 2005, Date of website printout Jan. 23, 2006.

*Primary Examiner*—Mark V. Prenty  
(74) *Attorney, Agent, or Firm*—Wolf, Greenfield & Sacks, P.C.

(57) ABSTRACT

A light-emitting device is provided. The device may include a thermally conductive region in contact with a wavelength-converting region (e.g., a phosphor region). The thermally conductive region may aid in the extraction of heat resulting from light absorption in the wavelength-converting region, which, if excessive, may impair device operation. The presence of a thermally conductive region can enable devices including wavelength-converting regions to operate even at high power levels (e.g., light generated by the light-generating region and/or by the light-emitting device having a total power greater than 0.5 Watts) for long operating lifetimes (e.g., greater than 2,000 hours).

60 Claims, 15 Drawing Sheets

U.S. PATENT DOCUMENTS

| | | |
|---|---|---|
| 6,812,503 B2 | 11/2004 | Lin |
| 6,828,724 B2 | 12/2004 | Burroughes |
| 6,849,876 B1 | 2/2005 | Chen |
| 6,864,571 B2 | 3/2005 | Arik |
| 6,881,980 B1 | 4/2005 | Ting |
| 6,885,033 B2 | 4/2005 | Andrews |
| 6,891,203 B2 | 5/2005 | Kozawa |
| 6,900,587 B2 | 5/2005 | Suehiro |
| 6,914,261 B2 | 7/2005 | Ho |
| 6,943,379 B2 | 9/2005 | Suehiro |
| 6,956,247 B1 | 10/2005 | Stockman |
| 6,964,501 B2 | 11/2005 | Ryan |
| 7,091,653 B2 * | 8/2006 | Ouderkirk et al. .......... 313/113 |
| 2003/0141563 A1 | 7/2003 | Wang |
| 2004/0124002 A1 | 7/2004 | Mazzochette |
| 2004/0150997 A1 | 8/2004 | Ouderkirk |
| 2004/0207319 A1 | 10/2004 | Erchak |
| 2004/0207323 A1 | 10/2004 | Erchak |
| 2004/0222433 A1 | 11/2004 | Mazzochette |
| 2005/0110036 A1 | 5/2005 | Park |
| 2005/0133808 A1 | 6/2005 | Uraya |
| 2005/0211991 A1 | 9/2005 | Mori |
| 2005/0231983 A1 | 10/2005 | Dahm |
| 2005/0258435 A1 | 11/2005 | Erchak |
| 2005/0258438 A1 | 11/2005 | Arik |

* cited by examiner (d)

(e)

WAVELENGTH-CONVERTING LIGHT-EMITTING DEVICES

FIELD OF INVENTION

The invention relates generally to light-emitting devices, as well as related components, systems and methods, and, more particularly to light-emitting diodes (LEDs) and associated wavelength-converting regions.

BACKGROUND

Light-emitting devices may include a wavelength-converting region (e.g., phosphor region) which can absorb light from a light-generating region (e.g., semiconductor region within an LED) and emit light having a different wavelength. As a result, a light-emitting device incorporating a wavelength-converting region can emit light having wavelength(s) that may not be possible using an LED without such regions.

For example, a GaN-based LED may emit blue light which can be converted to yellow light by a (Y,Gd)(Al,Ga) G:$Ce^{3+}$ or "YAG" (yttrium, aluminum, garnet) phosphor. Any unconverted blue light can be filtered so that the light-emitting device can emit only yellow light. In another example, the combined emission from a GaN-based LED and a YAG phosphor may generate white light as a result of combining blue light emitted from the LED and yellow light generated by the phosphor due to the conversion of some of the blue light.

SUMMARY OF INVENTION

The invention provides light-emitting devices, as well as related components, systems and methods.

In one embodiment, a light-emitting device is provided. The device comprises a light-generating region adapted to generate light, a wavelength-converting region, and a thermally conductive region. The wavelength-converting region is capable of absorbing light generated by the light-generating region and emitting light having a different wavelength than a wavelength of the light generated by the light-generating region. The thermally conductive region is in contact with the wavelength-converting region and is capable of conducting heat generated in the wavelength-converting region. The thermally conductive region comprises a material having a thermal conductivity greater than a thermal conductivity of the wavelength-converting region. The light-emitting device is adapted to emit light having a total power of greater than 0.5 Watts.

In another embodiment, a light-emitting device is provided. The device comprises a light-generating region adapted to generate light, a wavelength-converting region, and a thermally conductive region. The wavelength-converting region is capable of absorbing light generated by the light-generating region having a total power of greater than 0.5 Watts and emitting light having a different wavelength than a wavelength of the light generated by the light-generating region. The thermally conductive region is in contact with the wavelength-converting region and is capable of conducting heat generated in the wavelength-converting region. The thermally conductive region comprises a material having a thermal conductivity greater than a thermal conductivity of the wavelength-converting region.

In another embodiment, a method of operating a light-emitting device is provided. The method includes generating light in a light-generating region of an LED having a total power of greater than 0.5 Watts. The method further includes absorbing light generated by the light-generating region in a wavelength-converting region and emitting light having a wavelength different than a wavelength of the light generated in the light-generating region. The method further includes emitting light from the light-emitting device. The device has an operating lifetime of greater than 2,000 hours.

In another embodiment, a method of forming a light-emitting device is provided. The method comprises forming a light-generating region adapted to generate light, and forming a wavelength-converting region capable of absorbing light generated by the light-generating region and emitting light having a different wavelength than a wavelength of the light generated by the light-generating region. The method further comprises forming a thermally conductive region in contact with the wavelength-converting region and capable of conducting heat generated in the wavelength-converting region, wherein the thermally conductive region comprises a material having a thermal conductivity greater than a thermal conductivity of the wavelength-converting region. The light-emitting device is adapted to emit light having a total power of greater than 0.5 Watts.

Other aspects, embodiments and features of the invention will become apparent from the following detailed description of the invention when considered in conjunction with the accompanying drawings. The accompanying figures are schematic and are not intended to be drawn to scale. In the figures, each identical, or substantially similar component that is illustrated in various figures is represented by a single numeral or notation. For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

Certain embodiments of the invention provide light-emitting devices and methods associated with such devices. The light-emitting devices may include a thermally conductive region in contact with a wavelength-converting region (e.g., a phosphor region). The wavelength-converting region can absorb light emitted by a light-generating region (e.g., a semiconductor region) of the device and emit light having a different wavelength than that absorbed. In this manner, the light-emitting devices can emit light of wavelength(s) (and, thus, color) that may not be obtainable from devices that do not include wavelength-converting regions. As described further below, the thermally conductive region may aid in the extraction of heat resulting from light absorption in the wavelength-converting region, which, if excessive, may impair device operation. The presence of a thermally conductive region can enable devices including wavelength-converting regions to operate even at high power levels (e.g., light generated by the light-generating region and/or by the light-emitting device having a total power greater than about 0.5 Watts) for long operating lifetimes (e.g., greater than 2,000 hours).

Figure 1A:
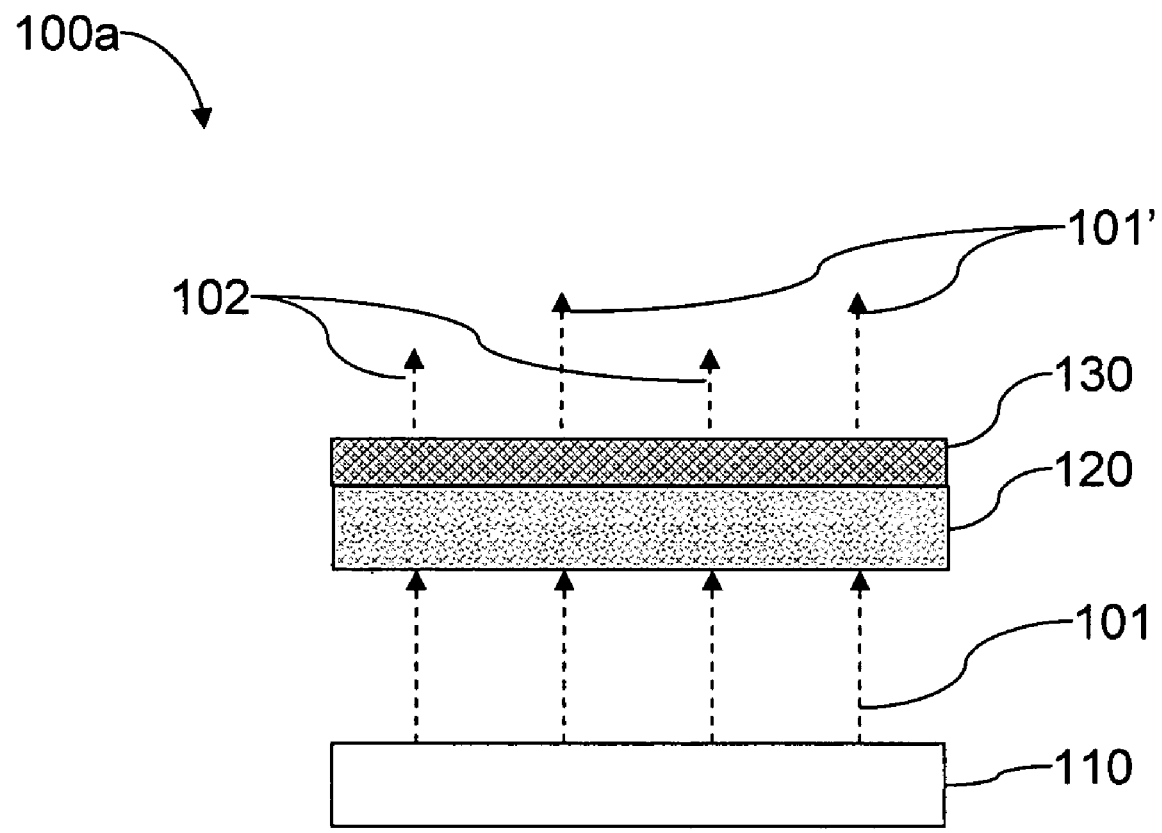
FIG. 1a is schematic of a light-emitting device including a light-generating region, a wavelength-converting region and a thermally conductive region in accordance with one embodiment of the invention.

FIG. 1a illustrates a light-emitting device 100a including a light-generating region 110, a wavelength-converting region 120, and a thermally conductive region 130 in contact with at least a portion of the wavelength-converting region 120, in accordance with some embodiments. As further discussed below, the light-generating region may be an LED that includes an active region (e.g., a quantum well structure). Region 110 may be operated to generate light 101 that enters the wavelength-converting region 120, where at least some of the light is converted to light 102 having one or more wavelengths different than the wavelength of generated light 101. As shown, a portion of light 101, namely light 101', may pass through the wavelength-converting region without being converted to light having a different wavelength (i.e., light 102). However, it should be understood that, in other embodiments, substantially all of the light being generated in region 110 is converted in the wavelength-converting region. In the illustrative embodiment, the emission of light from the light-emitting device includes the combination of light 101' and light 102. For example, if light 101' has a wavelength characteristic of blue light and light 102 has a wavelength characteristic of yellow light, then the combined emission (i.e., light 101' and 102) may appear white.

Figure 1B:
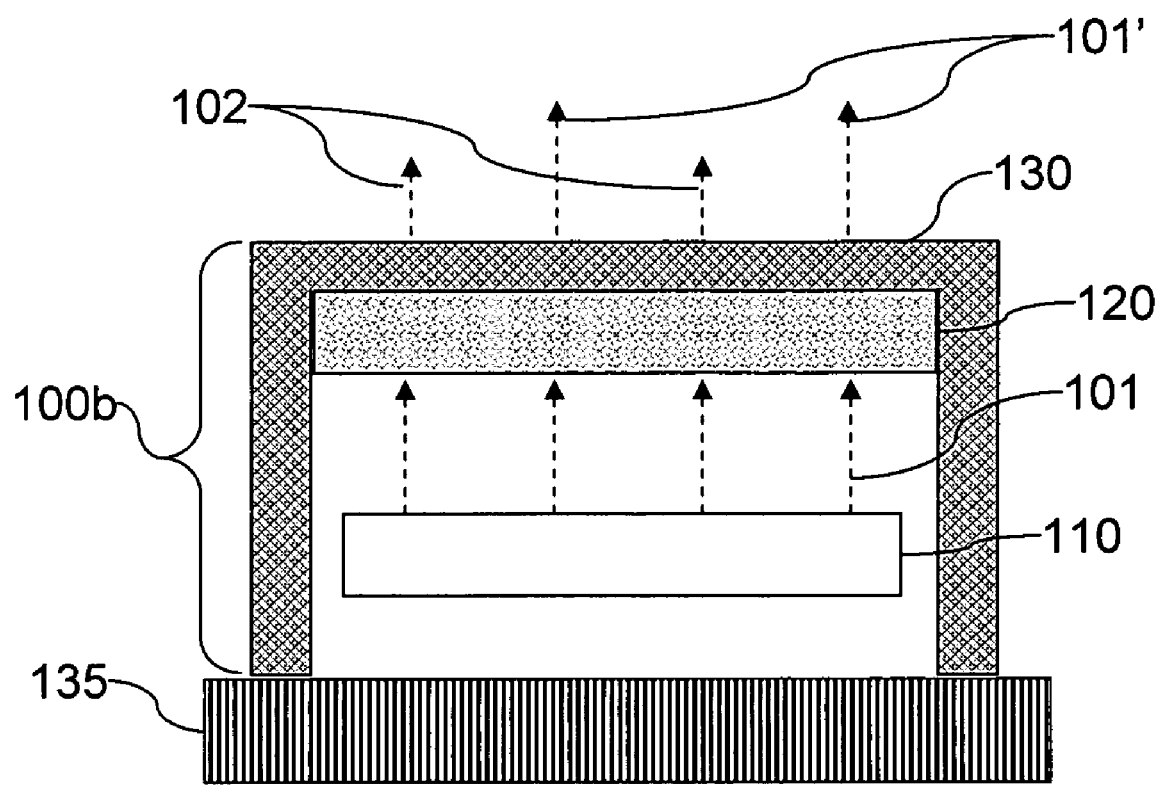
FIG. 1b is schematic of a light-emitting device including a light-generating region, a wavelength-converting region and a thermally conductive region, where the thermally conductive region is in thermal contact with a heat sink, in accordance with one embodiment of the invention.

FIG. 1b illustrates a light-emitting device 100b similar to the light-emitting device 100a, but having a thermally conductive region 130 in thermal contact with a heat sink 135 that may be external to device 100b.

It should be understood that not all of the features shown in FIGS. 1a and 1b need be present in all embodiments of the invention and that the illustrated features may be otherwise positioned within the light-emitting device. Also, additional features may be present in other embodiments. Additional embodiments are shown in the other figures and/or described further below.

When a feature (e.g., layer, region, substrate, heat sink) is referred to as being "on", "over" or "overlying" another feature, it can be directly on the feature, or an intervening feature (e.g., layer) also may be present. A feature that is "directly on" or "in contact with" another feature means that no intervening feature is present. It should also be understood that when a feature is referred to as being "on", "over", "overlying", or "in contact with" another feature, it may cover the entire feature or a portion of the feature. A feature that is "adjacent" to another feature may be directly on, directly under, or directly next to another feature.

The light-generating region may be an LED or a portion of an LED. For example, the light-generating region 110 may be an active region (e.g., semiconductor region) of an LED, though it should be understood that the invention is not so limited. When the light-generating region is an active region an LED, it should be understood that the LED may be any suitable diode that emits light. In general, LEDs include an active region comprising one or more semiconductors materials, including III–V semiconductors (e.g., gallium arsenide, aluminum gallium arsenide, gallium aluminum phosphide, gallium phosphide, gallium arsenide phosphide, indium gallium arsenide, indium arsenide, indium phosphide, gallium nitride, indium gallium nitride, indium gallium aluminum phosphide, aluminum gallium nitride, as well as combinations and alloys thereof), II–VI semiconductors (e.g., zinc selenide, cadmium selenide, zinc cadmium selenide, zinc telluride, zinc telluride selenide, zinc sulfide, zinc sulfide selenide, as well as combinations and alloys thereof), and/or other semiconductors.

It should also be understood that the light-generating region may be other types of light-emitting devices including lasers, or portions thereof. It should also be understood that the light-generating region may be an array including more than one LED or portions thereof.

Figure 1C:
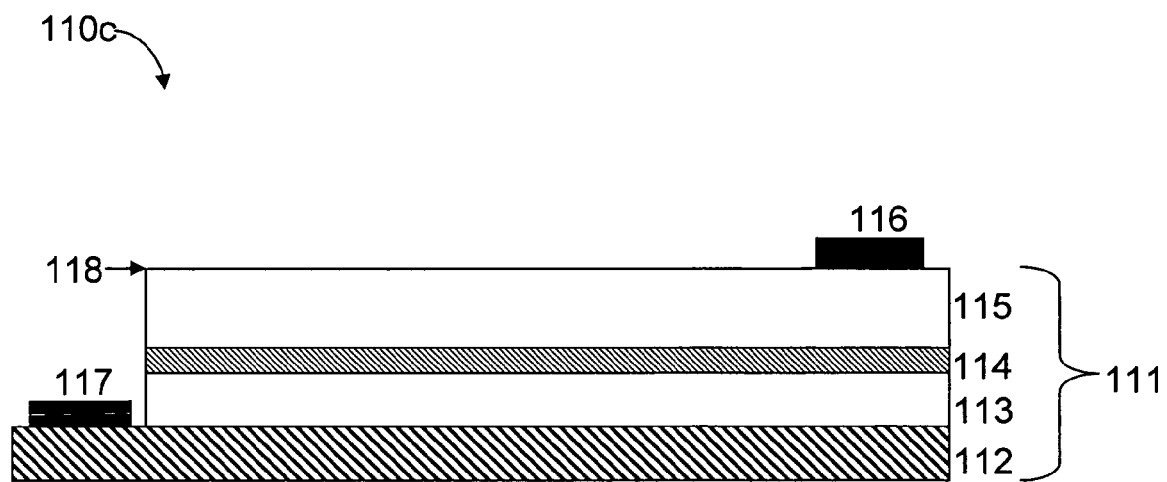
FIG. 1c is a schematic of a representative LED that may be used as a light-generating region in the devices of FIGS. 1a and 1b in accordance with one embodiment of the invention.

FIG. 1c illustrates a representative LED 110c. The LED comprises a multi-layer stack 111 that may be disposed on a sub-mount (not shown). The multi-layer stack 111 can include an active region 114 which is formed between n-doped layer(s) 115 and p-doped layer(s) 113. The stack also includes a conductive layer 112. An n-side contact pad 116 is disposed on layer 115, and a p-side contact pad 117 is disposed on conductive layer 112. It should be appreciated that the LED is not limited to the configuration shown in FIG. 1c, for example, the n-doped and p-doped sides may be interchanged so as to form an LED having a p-doped region in contact with the contact pad 116 and an n-doped region in contact with the contact pad 117. As described further below, electrical potential may be applied to the contact pads which can result in light generation within active region 114 and emission of at least some of the light generated through an emitting surface 118.

Figure 1D:
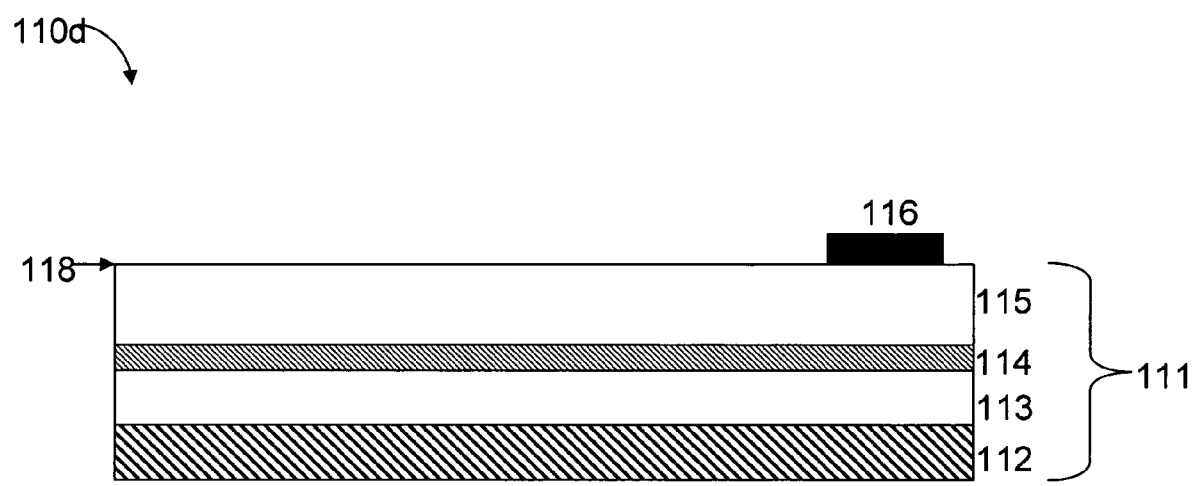
FIG. 1d is a schematic of another representative LED that may be used as a light-generating region in the devices of FIGS. 1a and 1b in accordance with one embodiment of the invention.

FIG. 1*d* illustrates another representative LED 110*d*. The LED 110*d* is similar in many respects to LED 110*c*, except that electrode 117 is absent. Instead, electrical contact to the layer(s) 113 is made via conductive layer 112 through a conductive submount (not shown) which is attached to conductive layer 112. It should be understood that various other modifications can be made to the representative LED structures presented, and that the invention is not limited in this respect.

In some embodiments, the active region of an LED includes one or more quantum wells surrounded by barrier layers. The quantum well structure may be defined by a semiconductor material layer (e.g., in a single quantum well), or more than one semiconductor material layers (e.g., in multiple quantum wells), with a smaller band gap as compared to the barrier layers. Suitable semiconductor material layers for the quantum well structures include InGaN, AlGaN, GaN and combinations of these layers (e.g., alternating InGaN/GaN layers, where a GaN layer serves as a barrier layer).

In some embodiments, the n-doped layer(s) 115 include a silicon-doped GaN layer (e.g., having a thickness of about 300 nm thick) and/or the p-doped layer(s) 113 include a magnesium-doped GaN layer (e.g., having a thickness of about 40 nm thick). The conductive layer 112 may be a silver layer (e.g., having a thickness of about 100 nm), which may also serve as a reflective layer (e.g., that reflects upwards any downward propagating light generated by the active region 114). Furthermore, although not shown, other layers may also be included in the LED; for example, an AlGaN layer may be disposed between the active region 114 and the p-doped layer(s) 113.

It should be understood that compositions other than those described herein may also be suitable for the layers of the LED.

In some embodiments, emitting surface 118 of the LED has a dielectric function that varies spatially which can improve the extraction efficiency of light generated by the LED and may enable the high power levels described further below. For example, the dielectric function can vary spatially according to a pattern. The pattern may be periodic (e.g., having a simple repeat cell, or having a complex repeat super-cell), periodic with de-tuning, or non-periodic. Examples of non-periodic patterns include quasi-crystal patterns, for example, quasi-crystal patterns having 8-fold symmetry. A non-periodic pattern can also include random surface roughness patterns having a root-mean-square (rms) roughness on the order of the wavelength of the generated light. In certain embodiments, the emitting surface is patterned with openings which can form a photonic lattice. Suitable LEDs having a dielectric function that varies spatially (e.g., a photonic lattice) have been described in, for example, U.S. Pat. No. 6,831,302 B2, entitled "Light Emitting Devices with Improved Extraction Efficiency," filed on Nov. 26, 2003, which is herein incorporated by reference in its entirety.

Figure 1E:
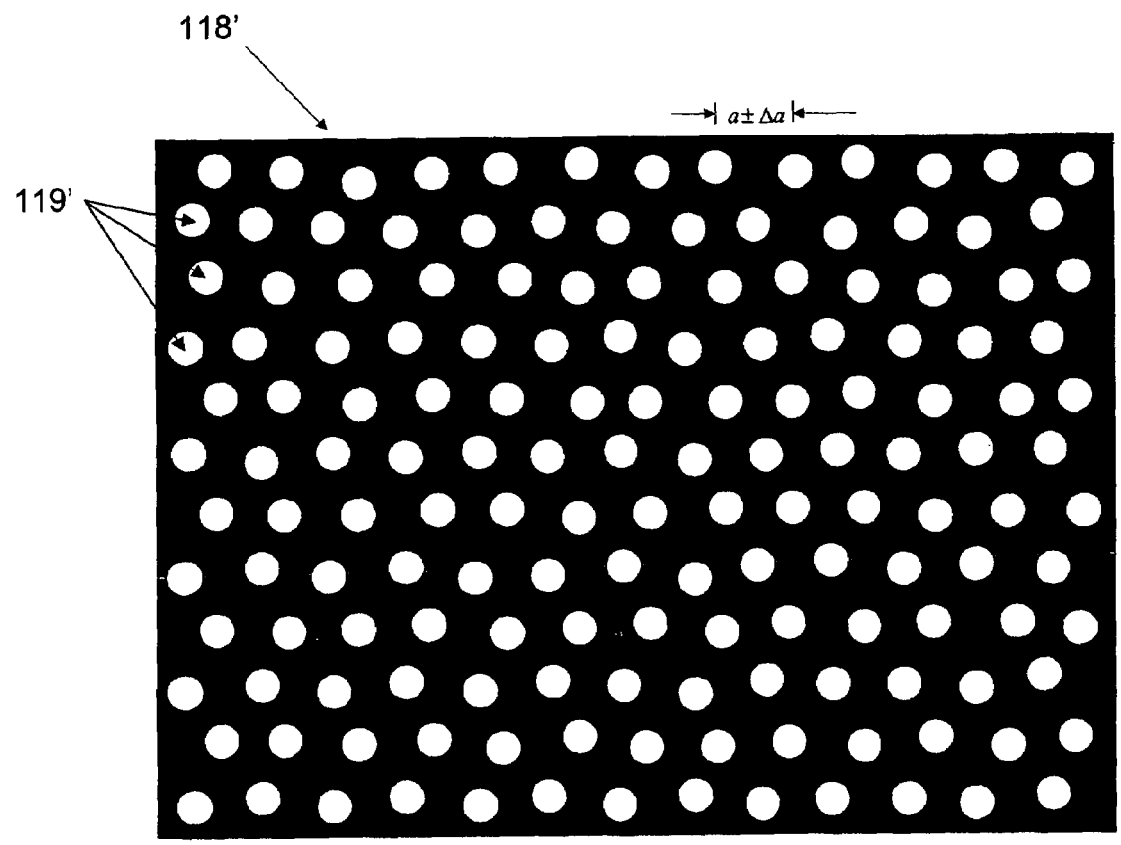
FIG. 1e is a top view of a representative LED emitting surface having a dielectric function that varies spatially and which can be used in the LEDs of FIGS. 1c and 1d in accordance with one embodiment of the invention.

FIG. 1*e* illustrates a representative LED emitting surface 118' having a dielectric function that varies spatially. In this example, the spatial variation of the dielectric function is a result of openings in the emitting surface 118' of the LED.

In the illustration of FIG. 1*e*, the emitting surface 118' is not flat, but rather consists of a modified triangular pattern of openings 119'. In general, various values can be selected for the depth of openings 119', the diameter of openings 119' and/or the spacing between nearest neighbors in openings 1119'. The triangular pattern of openings may be detuned so that the nearest neighbors in the pattern have a center-to-center distance with a value between (a−Δa) and (a+Δa), where "a" is the lattice constant for an ideal triangular pattern and "Δa" is a detuning parameter with dimensions of length and where the detuning can occur in random directions. In some embodiments, to enhance light extraction from the LED, a detuning parameter, Δa, is generally at least about one percent (e.g., at least about two percent, at least about three percent, at least about four percent, at least about five percent) of ideal lattice constant, a, and/or at most about 25% (e.g., at most about 20%, at most about 15%, at most about 10%) of ideal lattice constant, a. In some embodiments, the nearest neighbor spacings vary substantially randomly between (a−Δa) and (a+Δa), such that pattern of openings is substantially randomly detuned. For the modified triangular pattern of openings 119', a non-zero detuning parameter enhances the extraction efficiency of the LED. It should be appreciated that numerous other modifications are possible to the emitting surface of an LED while still achieving a dielectric function that varies spatially.

Light may be generated by LED 110*c* (or 110*d*) as follows. The p-side contact pad 117 (or conductive layer 112) can be held at a positive potential relative to the n-side contact pad 116, which causes electrical current to be injected into the LED. As the electrical current passes through the active region, electrons from n-doped layer(s) 115 can combine in the active region with holes from p-doped layer(s) 113, which can cause the active region to generate light. The active region can contain a multitude of point dipole radiation sources that emit light (e.g., isotropically) within the region with a spectrum of wavelengths characteristic of the material from which the active region is formed. For InGaN/GaN quantum wells, the spectrum of wavelengths of light generated by the light-generating region can have a peak wavelength of about 445 nanometers (nm) and a full width at half maximum (FWHM) of about 30 nm, which is perceived by human eyes as blue light.

In other embodiments, the light-generating region can generate light having a peak wavelength corresponding to ultraviolet light (e.g., having a peak wavelength of about 370–390 nm), violet light (e.g., having a peak wavelength of about 390–430 nm), blue light (e.g., having a peak wavelength of about 430–480 nm), cyan light (e.g., having a peak wavelength of about 480–500 nm), green light (e.g., having a peak wavelength of about 500 to 550 nm), yellow-green (e.g., having a peak wavelength of about 550–575 nm), yellow light (e.g., having a peak wavelength of about 575–595 nm), amber light (e.g., having a peak wavelength of about 595–605 nm), orange light (e.g., having a peak wavelength of about 605–620 nm), red light (e.g., having a peak wavelength of about 620–700 nm), and/or infrared light (e.g., having a peak wavelength of about 700–1200 nm).

As noted above, it may be preferable in certain embodiments for region 110 to generate light having a high power. Thus, in embodiments where the light-generating region is an LED, the light emitted by the LED can have a high power. For example, the light generated by region 110 may have a total power greater than 0.5 Watts, greater than 1 Watt, greater than 5 Watts, or greater than 10 Watts. In some cases, the light generated has a total power of less than 100 Watts, though this should not be construed as a limitation of all embodiments of the invention. The desired power depends, in part, on the application. The total power of the generated light can be measured by using an integrating sphere equipped with spectrometer, for example a SLM12 from Sphere Optics Lab Systems The light generated by region 110 may also have a high total power flux. As used herein, the term "total power flux" refers to the total power divided by the emission area. In some embodiments, the total power flux is greater than 0.03 Watts/mm$^2$, greater than 0.05 Watts/mm$^2$, greater than 0.1 Watts/mm$^2$, or greater than 0.2 Watts/mm$^2$.

Wavelength-converting region 120 is a region that can include one or more wavelength-converting materials that can convert the wavelength of absorbed light. The wavelength-converting materials can function by absorbing light having a first wavelength and emitting light having a second wavelength (e.g., longer wavelengths).

In some preferred embodiments, the wavelength-converting region includes a phosphor material. The phosphor material can be present in particulate form. The particles may be distributed in a second material (e.g., an encapsulant or adhesive, such as epoxy) to form a composite structure.

Any suitable phosphor material may be used. In some embodiments, the phosphor material may be a yellow phosphor material (e.g., $(Y,Gd)(Al,Ga)G:Ce^{3+}$, sometimes referred to as a "YAG" (yttrium, aluminum, garnet) phosphor), a red phosphor material (e.g., $L_2O_2S:Eu^{3+}$), a green phosphor material (e.g., ZnS:Cu,Al,Mn), and/or a blue phosphor material (e.g., $(Sr,Ca,Ba,Mg)_{10}(PO_4)_6Cl:Eu^{2+}$).

In some embodiments, the wavelength-converting region may include nanodots (also, referred to as "quantum dots" or "semiconductor nanocrystals"). The nanodots can be distributed in a second material (e.g., an encapsulant or adhesive, such as epoxy, or an insulator, such as glass) to form a composite structure. For example, semiconductor nanodots can be formed of group IV semiconductors (e.g., silicon, germanium), III–V semiconductors, II–VI semiconductors, and combinations thereof, as the invention is not limited so.

Nanodots can include a core region, formed of a suitable material, and one or more shell layers. Light emission wavelength(s) from the nanodots can depend on the materials that form the nanodots and/or the diameter of the nanodots. These factors can influence the energy levels of carriers (e.g., electrons, holes) within the nanodots and hence determine absorption and/or emission wavelength(s). For example, nanodots having a CdSe core and a diameter of about 1.9 nm to about 6.7 nm may emit light having wavelengths between about 465 nm to 640 nm; nanodots having a CdSe core, a ZnS shell, and a diameter of about 2.9 nm to about 6.1 nm may emit light having wavelengths between 490 nm to 620 nm; nanodots having a CdTe core, a CdS shell, and a diameter of about 3.7 nm to about 4.8 nm may emit light having wavelengths between 620 nm to 680 nm; nanodots having a PbS core and a diameter of about 2.3 nm to about 2.9 nm may emit light having wavelengths between 850 nm to 950 nm; nanodots having a PbSe core and a diameter of about 3.5 nm to about 9 nm may emit light having wavelengths between 1200 nm to 2340 nm.

As described further below, the wavelength-converting region may be in the form of a coating on one or more surfaces within the light-emitting device 100a or 100b (e.g., the surface of a package window, the surface of an LED, etc.). The wavelength converting region may comprise multiple layers including different wavelength-converting materials, which can be disposed over each other.

Although the illustrations of FIGS. 1a and 1b show the wavelength-converting region as a layer disposed over the light-generating region and in contact with the thermally conductive region along a top surface, it should be appreciated that other configurations are possible. As described further below, the wavelength-converting region may be configured in any manner so as to facilitate the conversion of part or all of the light emitted by the light-generating region.

As noted above, some, or substantially all, of the light generated by region 110 may be converted to light of different wavelength(s) by the wavelength-converting region 120. If desired, any part of the light from region 110 that is not converted by the wavelength-converting region 120 can be filtered from the emission of the light-emitting device 100a or 100b (e.g., using a filter in the path of light emission 101' and 102), thereby resulting in emitted light having only the wavelength(s) generated by the wavelength-converting region. In some embodiments, the filter may reflect non-converted light back through the wavelength-converting region so that it may be converted. In further embodiments, a filter can be disposed under the wavelength-converting region which can allow light from the LED to pass while reflecting light generated in the wavelength-converting region.

In other embodiments, it may be desirable to combine the light converted by the wavelength-converting region 120 with the non-converted light from region 110 so as to produce a combined emission spectra. In such embodiments, a filter need not necessarily be used to filter out wavelengths of light. As described below, this approach may be used to generate white light. In further embodiments, an antireflective coating can be used to enhance emission out of the wavelength-converting region.

In some embodiments, it may be desirable for the light-emitting device to emit light that is substantially white. In such embodiments, the wavelength-converting region can emit yellow light, for example, a $(Y,Gd)(Al,Ga)G:Ce^{3+}$ phosphor. When pumped by blue light generated by the light-generating region (e.g., a GaN LED), the wavelength-converting region can be activated and emit light (e.g., isotropically) with a broad spectrum centered around yellow wavelengths (e.g., about 575–595 nm). A viewer of the total light spectrum emerging from light-emitting device 100a or 100b sees the yellow broad emission spectrum from the wavelength-converting region and the blue narrow emission spectrum from the light-generating region (e.g., from the GaN LED) and typically mixes the two spectra to perceive white.

In other embodiments, light generated by the light-generating region 110 can have a spectrum centered in the ultraviolet (or violet, or blue) wavelength range, and the wavelength-converting region 120 can emit light having a plurality of wavelengths including red, green, and blue wavelengths. For example, the wavelength-converting region can include a red phosphor material (e.g., $L_2O_2S:Eu^{3+}$), a green phosphor material (e.g., ZnS:Cu,Al,Mn), and a blue phosphor material (e.g., $(Sr,Ca,Ba,Mg)_{10}(PO_4)_6Cl:Eu^{2+}$). In other examples, the wavelength-converting region can include nanodots that can emit light having a plurality of wavelengths including red, green, and blue wavelengths. A viewer of the total light spectrum emerging from the light-emitting device sees the emission spectrum from the combined wavelength-converting region emission, including red, green, and blue emissions, and mixes these spectra to perceive white light.

In some embodiments, it may be preferred that the wavelength-converting region absorbs light generated by region 110 having the high total power values (as well as, power flux and power density) noted above. It also may be preferable for the wavelength-converting region to emit light having the same high total power values. The wavelength-converting region may emit light having a total power greater than 0.5 Watts, greater than 1 Watt, greater than 5 Watts, or greater than 10 Watts. In some cases, the light emitted by the wavelength-converting region has a total power of less than 100 Watts, though this should not be construed as a limitation of all embodiments of the invention. The desired power depends, in part, on the application.

It should be understood that the total power of light emitted from the wavelength-converting region may be equal to the total power of light emitted from the device.

It should also be understood that the wavelength-converting region may emit light having a lower power than the power of the light generated by the light generating region because of absorption within the wavelength-converting region. For example, the wavelength-converting region may emit light having a power of about 50% (or between 50% and 100%) the power of light generated by the light-generating region. However, in these cases, the light emitted by the wavelength-converting region (and device) still can have a high power.

It should be appreciated that the power flux out of the wavelength-converting region is dependent on the emission area of the wavelength-converting region. As such, the power flux out of the wavelength-converting region can be less than the power flux out of the light-generating region since the wavelength-converting region can have an emission area that is larger than that of the light-generating region. For example, the light-generating region may have an area of about 10 mm and the wavelength-generating region may have an emission area of about 100 $mm^2$. In some embodiments, the wavelength-converting region may emit light having a total power flux of greater than 3 $mWatts/mm^2$, greater than 5 $mWatts/mm^2$, greater than 10 $mWatts/mm^2$, or greater than 20 $mWatts/mm^2$. In addition to power flux, a total power density for the emission out of the wavelength-converting region can be determined by dividing the total power of light emitted out of the wavelength-converting region by the volume of the wavelength-converting region. For example, the wavelength-converting region may have a volume of 100 $mm^3$ based on an emission area of 100 $mm^2$ and a thickness of 10 mm. In some embodiments, the wavelength-converting region can have a total power density of greater than 0.5 $mWatts/mm^3$, greater than 1 $mWatts/mm^3$, greater than 5 $mWatts/mm^3$, or greater than about 10 $mWatts/mm^3$.

Such high powers can generate substantial amounts of heat in the wavelength-converting region which can impede the proper functioning of the light-emitting device. For example, such power levels can lead to premature device failure, discoloring of the matrix material surrounding the wavelength-converting material (e.g., phosphor particles, nanodots), wavelength shift in the emission spectra, degradation in the conversion efficiency of the wavelength-converting material, and/or mechanical failure such as delamination.

Thermally conductive region 130 can aid in the extraction of heat from the wavelength-converting region which can enable operation at such high powers and/or high brightnesses of generated light.

The thermally conductive region 130 may comprise of one or more structures (which may include a void) that conduct heat away from the wavelength-converting region. The thermally conductive region is typically in direct contact with the region so as to enable heat extraction and conduction away from the wavelength-converting region. In some embodiments, only a portion of the thermally conductive region is in contact with the wavelength-converting region. In other embodiments, substantially the entire area of the thermally conductive region is in contact with the wavelength-converting region. For example, the thermally conductive region may be surrounded by the wavelength-converting region. The thermally conductive region may include a single material layer, multiple material layers, or a portion of a layer.

In some embodiments, the thermally conductive region 130 may include channels in which fluid (e.g., gas, such as air, and/or liquid, such as water) may flow there through so as to aid in heat extraction and/or conduction.

The thermally conductive region may be formed of one or more materials that have a thermal conductivity larger than that of the wavelength-converting region. In some embodiments, the thermally conductive region may be formed of one or more metals (e.g., silver, copper, tungsten, molybdenum, aluminum, gold, platinum, palladium, etc.), metal oxides (e.g., indium tin oxide), ceramics (e.g., aluminum nitride ceramics), and/or other materials having a suitable thermal conductivity. In some embodiments, the thermally conductive region may include carbon in the form of diamond or nanotubes. In other embodiments, the thermally conductive region may comprise a composite of two or more different materials, such as copper tungsten, copper molybdenum, aluminum silicon, and/or aluminum silicon carbide.

In some embodiments, the thermally conductive region may be reflective to light emitted by the wavelength-converting region. In these embodiments, for example, the thermally conductive region may be formed of a suitable metal including those noted above. The thermally conductive region can serve as both a region than aids in the extraction of heat from the wavelength-converting region and a region that reflects light as desired for the operation of the light-emitting device.

In other embodiments, the thermally conductive region is substantially transparent to light emitted by the phosphor region 120 and/or the light-emitting device 100a or 100b. For example, the thermally conductive region may be formed of indium tin oxide, which may be substantially transparent (e.g., having a transmission coefficient greater than about 80%) for light having wavelengths greater than about 350 nm.

In some embodiments, the thermally conductive region can include a thin layer of metal (e.g., gold). In another embodiment, the thermally conductive region could form part or all of any filters incorporated into a window of the light-emitting device. In a further embodiment, a transparent host substrate, on which a wavelength-converting region is deposited, can serve as a thermally conductive region (e.g., a sapphire or diamond substrate). The thermally conductive regions can conduct heat away from the wavelength-converting region to a heat sink (e.g., external and/or internal to the light-emitting device).

Although the illustrations of FIGS. 1a and 1b show the thermally conductive region 130 on the top surface of the wavelength-converting region 120, it should be appreciated that other configurations are possible. As described further below, the thermally conductive region may be contact with a top surface of the wavelength-converting region or in contact with a sidewall of the wavelength-converting region; the thermally conductive region may be embedded in the wavelength-converting region, and/or may be in contact with the wavelength-converting region in any other way, as the invention is not limited in this respect. Furthermore, the thermally conductive region may serve multiple purposes. For example, the thermally conductive region may comprise all or a portion of a package frame of the light-emitting device.

In some embodiments, the thermally conductive region, itself, may also function as a heat sink. In such embodiments, the thermal mass of the thermally conductive region is sufficiently large to enable heat to be dissipated within the heat sink.

As shown in FIG. 1b, the thermally conductive region may be connected to a heat sink. It should be understood that any of the other embodiments described herein may include a heat sink connected to the thermally conductive region.

The heat sink may be combined with the light-emitting device 100b in any suitable configuration so as to facilitate heat extraction from the thermally conductive region 130. For example, the heat sink can be connected to the backside of the light-emitting device 100b, and the thermally conductive region 130 may include one or more surfaces exposed to the backside of the light-emitting device. Alternatively, or in addition to a heat sink that is external to the light-emitting device, a heat sink may be incorporated within the light-emitting device, as the invention is not limited so.

The heat sink may be formed of one or more metals (e.g., silver, copper, tungsten, molybdenum, aluminum, gold, platinum, palladium, etc.), ceramics, and/or other materials having a suitable thermal conductivity and heat capacity. In some embodiments, the heat sink may include aluminum nitride ceramics, and/or carbon. In other embodiments, the heat sink may include a composite of two or more different materials, such as copper tungsten, copper molybdenum, aluminum silicon, and/or aluminum silicon carbide.

The heat sink can include passive and/or active heat exchanging mechanisms, as the invention is not limited in this respect. Passive heat sinks can include structures formed of one or more materials that conduct heat as a result of temperature differences in the structure. Passive heat sinks may also include protrusions (e.g., fins, combs, spikes, etc.) which can increase the surface contact area with the surrounding atmosphere and therefore increase the rate of heat exchange with the atmosphere. For example, a passive heat sink may include a copper slug core, which provides a thermally conductive material that can conducts thermal energy to surrounding aluminum fins radiating out from the copper slug. In a further embodiment, a passive heat sink may also include channels in which fluid (e.g., liquid and/or gas) may flow there through so as to aid in heat extraction via convection within the fluid.

Active heat sinks may include one or more suitable means that can further aid in the extraction of heat. Such active heat sinks can include mechanical, electrical, chemical and/or any other suitable means to facilitate the exchange of heat. In one embodiment, an active heat sink may include a fan used to circulate air and therefore cool the heat sink. In another embodiment, a pump may be used to circulate a fluid (e.g., liquid and/or gas) within channels in the heat sink. In further embodiments, the heat sink may be connected to a thermal electric cooler that may further facilitate heat extraction from the heat sink. In other embodiments, the heat sink can include the thermal electric cooler, or may consist solely of a thermal electric cooler.

It should be appreciated that light-emitting devices of the invention may be any device that emits light, and is in no way limited by the illustrative light-emitting devices shown in FIGS. 1a and 1b. In one example, a light-emitting device may be a packaged LED comprising multiple elements (e.g., an LED (e.g., as shown in FIGS. 1c and 1d), a wavelength-converting region, and a thermally conductive region). Furthermore, a light-emitting device may comprise any configuration of the elements, and is not limited to the configuration of the illustrative light-emitting devices 100a and 100b. Also, the elements of the light-emitting device need not be structurally connected. For example, one or more of the elements of the light-emitting device may not be structurally connected to the other elements (e.g., the wavelength-converting region may not be structurally connected to the light-generating region).

Figure 2:
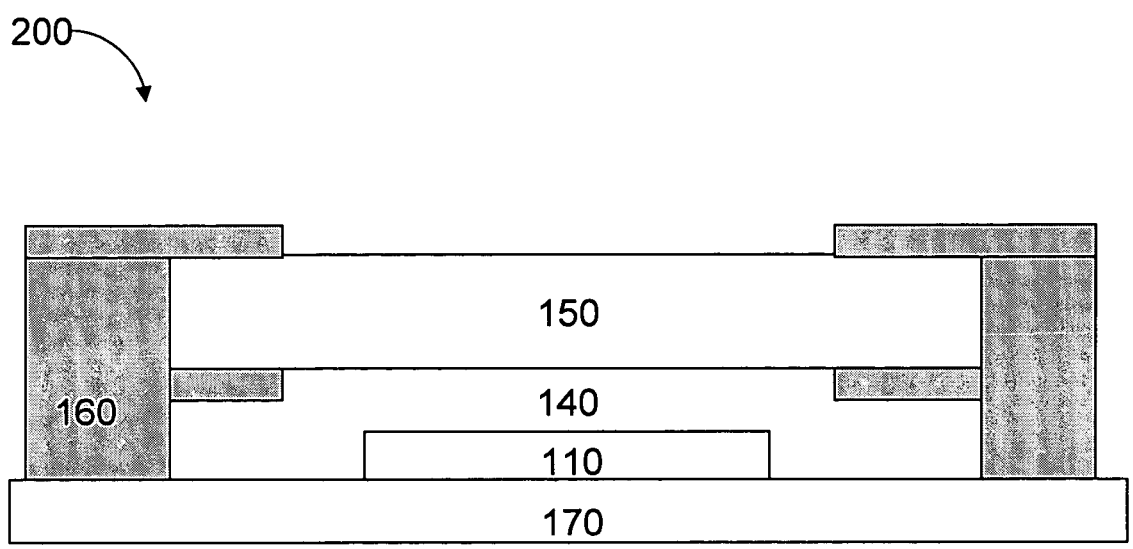
FIG. 2 is a schematic of a light-emitting device including a package window and frame in accordance with one embodiment of the invention.

FIG. 2 illustrates a light-emitting device 200 in accordance with some embodiments of the invention. The light-emitting device 200 comprises a light-generating region 110 (e.g., an LED or several LEDs) that is disposed over a package substrate 170, which can include electrically conductive portions, electrically isolating portions, and/or thermally conductive portions. Light generated by region 110 can pass through a region 140 and a window 150 and may be subsequently emitted from device 200. Region 140 may comprise an encapsulant (e.g., epoxy), a gas (e.g., air, nitrogen) or a vacuum. A wavelength-converting region (not shown) may be formed in the encapsulant (when region 140 includes an encapsulant) and/or the window. A window frame 160 of the package can function as a thermally conductive region which is in contact with at least a portion of the wavelength-converting region in the window and/or the encapsulant (when region 140 includes an encapsulant). Thus, heat generated within the wavelength-converting region may be conducted away from the region via the window frame.

Frame 160, in this embodiment, is made of a suitably thermally conductive material. The frame may also be in contact with the package substrate 170, as shown. In some embodiments, the frame can also include cooling channels enabling the flow of fluid (e.g., liquid and/or gas) that can be used to further aid in the extraction and conduction of heat. In such embodiments, a pump mechanism can be incorporated into the window frame to facilitate the flow of fluid through channels in the frame. In some embodiments, the window frame serves as a thermally conductive region that can extract heat from the wavelength-converting region. In other embodiments, the light-emitting device 200 and/or frame 160 can be in thermal contact with an external heat sink (not shown).

When the wavelength-converting region is formed as part of the window, the wavelength-converting material can be applied to the window using various techniques, including thin layer deposition, spin-coating, and injection molding. For example, wavelength-converting material can be added to a spin-on-glass solution and spun onto the window top and/or bottom surfaces, thereby forming one or more wavelength-converting layers. Alternatively or additionally, one or more wavelength-converting layers can be sandwiched between two or more window layers. In addition or alternatively, the wavelength-converting material may be incorporated homogeneously throughout the window or portions of the window. For example, wavelength-converting material (e.g., phosphor particles, nanodots) can be incorporated into the material that forms the window (e.g., glass). As discussed in detail below, the window can comprise multiple layers and/or structures.

When a wavelength-converting region is formed in the encapsulant of region 140 (for embodiments where region 140 comprises an encapsulant), the wavelength-converting material can be dispersed within the encapsulant material or can be layered over the encapsulant material.

In some embodiments, the window may also include a thermally conductive region. Heat conduction and/or dissipation mechanisms can be engineered into the window by the integration of thermally conductive materials and/or by increasing the surface area of the window. In embodiments where the frame and the window both include thermally conductive regions, these thermally conductive regions may be thermally coupled. For example, the thermally conductive region of the window may be able to facilitate the transport of heat out of the window and to the frame, thereby facilitating the cooling of the window.

In one embodiment, a LED and a phosphor containing window are arranged such as FIG. 2. The phosphor containing window may have a matching aspect ratio with respect to the emitting area of the LED. Such an aspect ratio can be design to match the aspect ratio of a microdisplay (i.e. 16:9, 4:3) or of a desired collection optic, which are described in commonly-owned Luminus Patent Application Publication No. 2005-0127375, which is incorporated herein by reference and is based on U.S. patent application Ser. No. 10/872,335, filed Jun. 18, 2004. In one embodiment, the length of at least one edge of the LED is greater than 1 mm. In another embodiment, the phosphor-containing window is the same dimensions of the emitting area of the LED.

FIGS. 3a–3e illustrate different embodiments of package windows suitable for use in light-emitting devices of the present invention.

Figure 3:
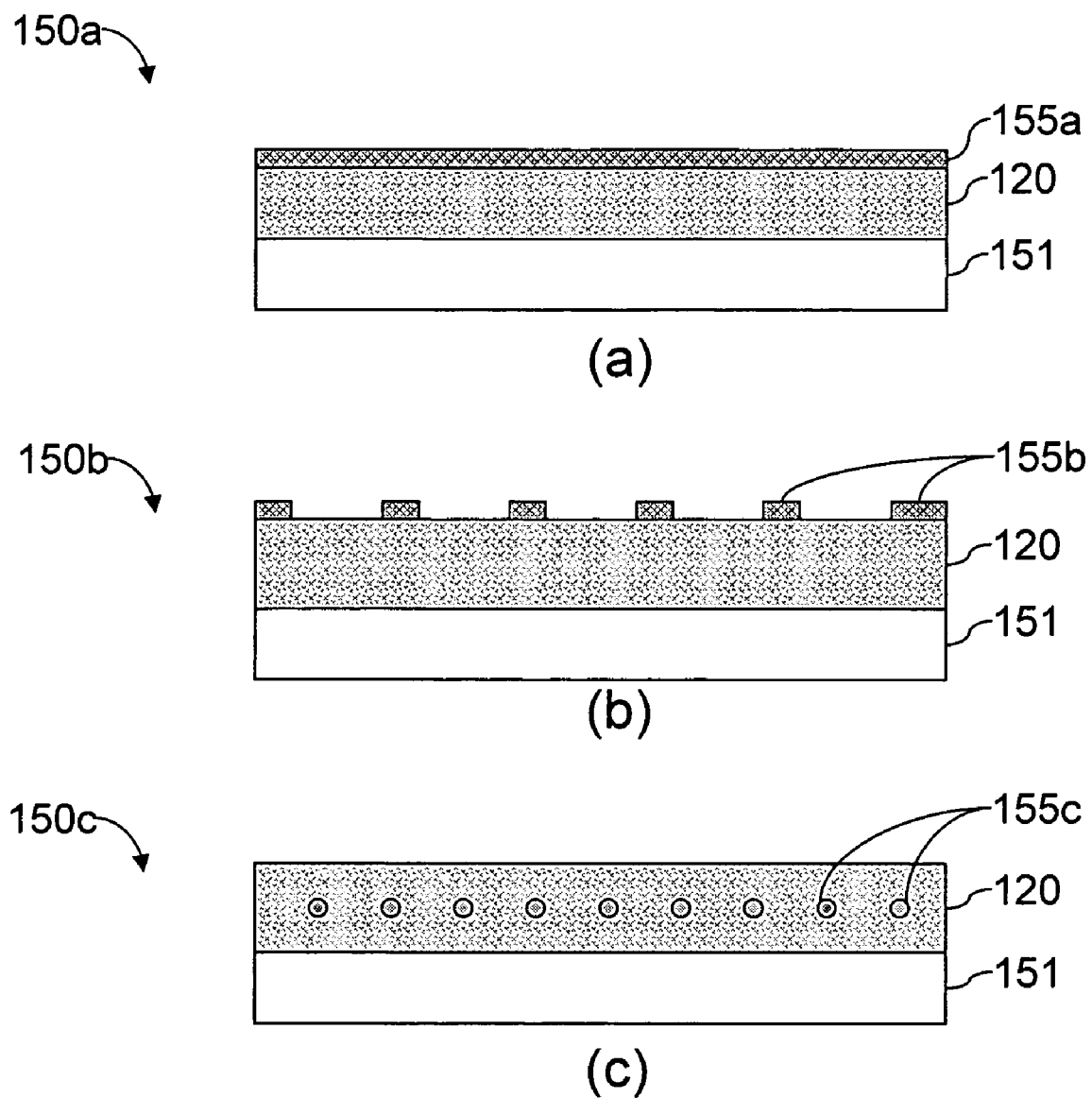
FIGS. 3a–3e are schematics of package windows suitable for use in light-emitting devices in accordance with some embodiments of the invention.
Figure 3:
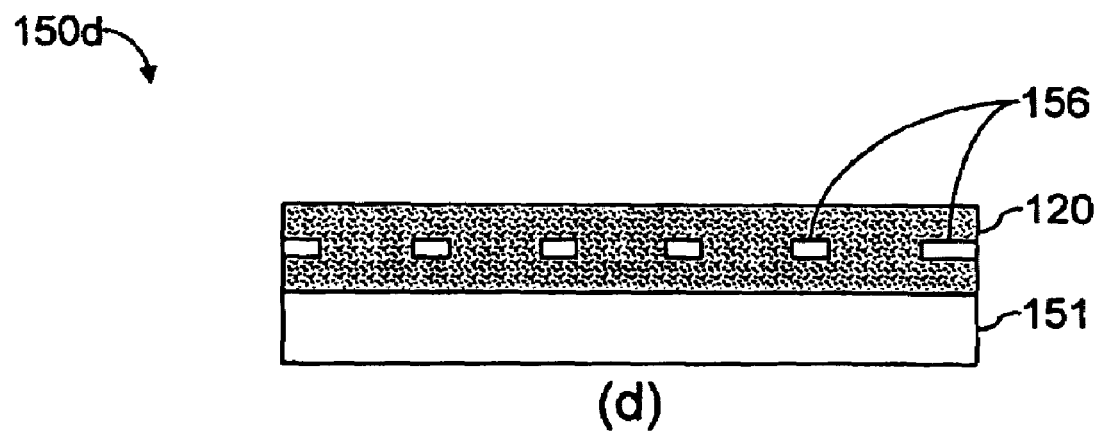
Figure 3:
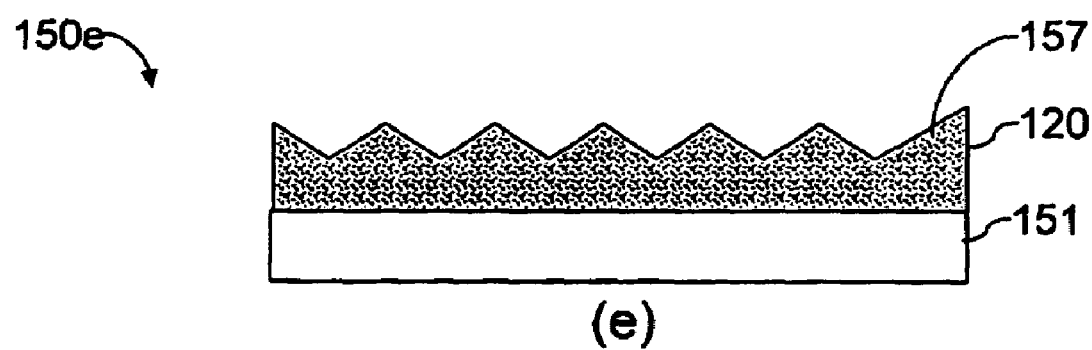

FIG. 3a illustrates an embodiment of a package window 150a of a light-emitting device where the window comprises a thermally conductive layer. The window includes a substrate 151 (e.g., glass), a wavelength-converting region 120, and a thermally conductive layer 155a in thermal contact with the wavelength-converting region and serving as a thermally conductive region. The thermally conductive layer may also be in thermal contact with a window frame (e.g. frame 160) of a light-emitting device (e.g., light-emitting device 200). In other embodiments, multiple thermally conductive layers can be sandwiched between wavelength-converting layers and/or multiple thermally conductive layers can be disposed upon each other.

The thermally conductive layer is typically transparent to the desired emission wavelength of the light-emitting device and can comprise a suitable material having a thermal conductivity larger than the thermal conductivity of the wavelength-converting region. For example, the thermally conductive layer can comprise a thin metal film (e.g., silver, gold, etc.), a metal oxide film (e.g., indium tin oxide), and/or a diamond coating.

FIG. 3b illustrates an embodiment of a package window 150b of a light-emitting device according to the invention. The window includes a patterned thermally conductive layer 155b, on the wavelength-converting region 120 that serves as a thermally conductive region. The pattern can be a 1-dimensional or 2-dimensional grid that can extend along the window and which can be in thermal contact with a window frame (e.g. frame 160) of a light-emitting device (e.g., light-emitting device 200).

Although the illustration of FIG. 3b shows the patterned layer on the surface of the wavelength-converting region 120, it should be appreciated that the patterned layer can be embedded in the wavelength-converting layer, in the substrate, and/or at the interface between the wavelength-converting layer and the substrate.

In some embodiments, it is believed that the patterning of thermally conductive layer 155b can improve light transmission through the window as compared to windows where the thermally conductive layer is continuous. Such embodiments can facilitate the use of a thicker thermally conductive layer which can in turn result in increased heat transfer.

FIG. 3c illustrates an embodiment of a package window 150c of a light-emitting device where a thermally conductive region is embedded within a wavelength-converting region. In some embodiments, the thermally conductive region may include thermally conductive structures 155c such as wires, fibers and/or tubes (e.g., carbon nanotubes). Although the illustration of FIG. 3c shows structures 155c embedded within the wavelength-converting region, it should be appreciated that the structures may also be positioned on the wavelength-converting region and/or at the interface between the wavelength-converting region and the substrate.

FIG. 3d illustrates an embodiment of a package window 150d of a light-emitting device where a thermally conductive region includes channels configured to have fluid (e.g., liquid and/or gas) flowing there through. Channels 156 can be formed in the wavelength-converting layer (or the window substrate 151). Liquid (e.g., water) and/or gas (e.g., air) can flow through channels 156 providing heat exchange with the surrounding wavelength-converting region 120, and thereby facilitating the cooling of the wavelength-converting region.

FIG. 3e illustrates an embodiment of a package window 150e of a light-emitting device where an increased surface area on the package window increases heat extraction. Increasing the surface area of the window can provide increased cooling. Patterning one or more surfaces is one method of increasing the surface area and thereby increasing the heat extraction from the wavelength-converting region, as shown in FIG. 3e. Without wishing to be bound by theory, it is believed that in some embodiments, a patterned emission surface on the window can also increase light extraction out of the package window.

In any of the above embodiments, the window substrate and/or wavelength-converting region can include thermally conductive particles (e.g., silver particles, gold particles, indium tin oxide particles, etc.). In another example, the window substrate could comprise a thermally conductive material layer that can be transparent to desired light emission wavelength(s) of the light-emitting device (e.g., diamond, sapphire, etc.).

In some embodiments, the windows can include anti-reflection coating(s) (ARC) which can increase or maximize transmission of light, generated by a light-generating region, through the window. Optionally, the window can include an environmental protection layer that can protect the wavelength-converting region in the light-emitting device from moisture.

It should be understood that in other embodiments the anti-reflection coatings may not be a part of the window and can otherwise be incorporated in the light-emitting device.

In certain embodiments, the windows can include one or more light filters. For example, a filter could be disposed beneath a wavelength-converting region which allows transmission of emitted light (e.g., UV, blue) from the light-generating region (e.g., an LED), but reflects converted light emitted from the wavelength-converting region to direct the desired emission out of the light-emitting device rather than inward.

In some embodiments, a filter can be disposed above a wavelength-converting region so as to transmit converted light emitted from the wavelength-converting region, but reflect unconverted light back into the wavelength-converting region and therefore increase light conversion. For example, such a filter could be advantageous when the light-generating region generates ultraviolet light. When a light-generating region generates blue light and white light emission is desired from the light-emitting device, a partial filter (e.g., a wire grid polarizing filter) can increase wavelength-converting region light conversion yet allow a portion of the blue light to be transmitted. In the case of a polarizing filter, the polarized light could be useful for certain applications (e.g., LCDs, holographic projections).

It should be understood that in other embodiments, filters may not be a part of the window and can otherwise be incorporated in the light-emitting device.

It should be appreciated that the layers (e.g., ARCs, filters, etc.) described above may be made of materials that possess heat conduction capabilities. As such, in some embodiments, layers can serve multiple functions (e.g., a broad-band ARC can serve as a filter and an ARC).

It should be understood that the windows of FIGS. 3a–3e may have other configurations. For example, though the windows are illustrated as planar, it should be appreciated that they can have any non-planar shape (e.g., concave or convex shaped).

Figure 4A:
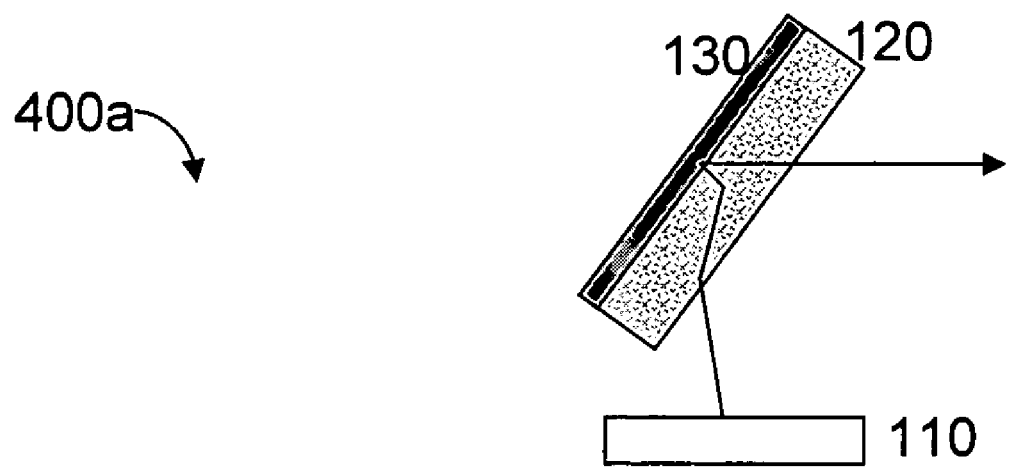
FIGS. 4a–b are schematics of light-emitting devices where a wavelength-converting region and a thermally conductive region are physically separated from a light-generating region in accordance with some embodiments of the invention.

FIG. 4a illustrates a light-emitting device 400a according to another embodiment of the invention. In this embodiment, the assembly of the wavelength-converting region 120 and the thermally conductive region 130 is physically separated from the light-generating region 110. The thermally conductive region 130 comprises a reflecting material (e.g., silver, aluminum, gold, platinum) and therefore can also serve as a reflecting surface. Light from region 110 can enter the wavelength-converting region and be reflected by the heat sink 130. During this process, a portion or all of the light from region 110 is converted by the wavelength-converting region. Converted light propagating away from the thermally conductive region is emitted out of the wavelength-converting region 130; while, converted light propagating towards the thermally conductive region is reflected and then subsequently also propagates out of the wavelength-converting region. In this embodiment, light does not transmit though the thermally conductive region and, as a result, a robust thermally conductive region can be employed.

Figure 4B:
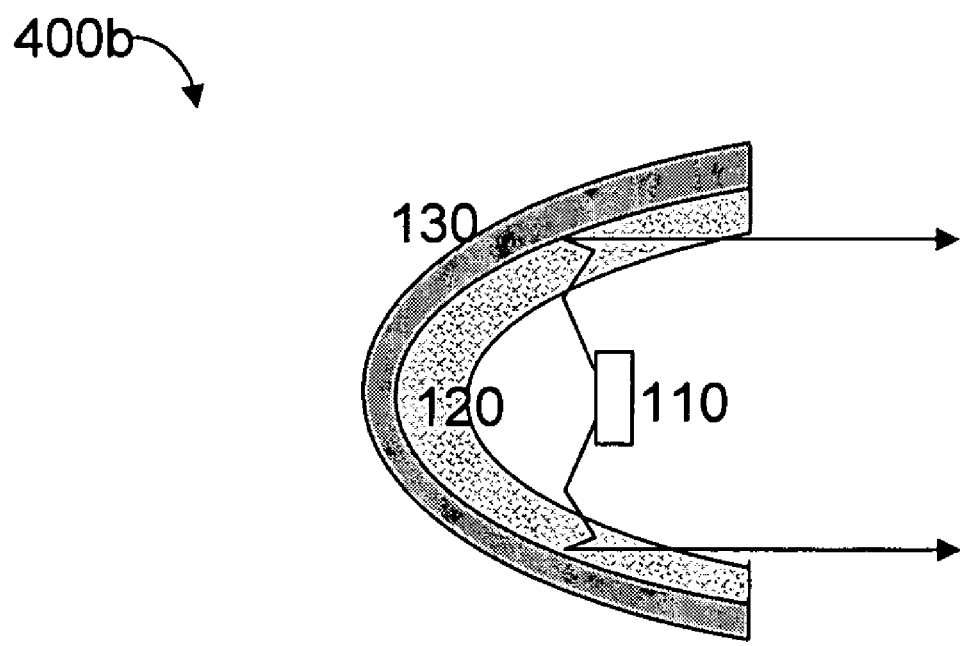

FIG. 4b illustrates a light-emitting device 400b according to another embodiment of the invention. In this embodiment, the wavelength-converting region and the thermally conductive region may be shaped such that emitted light is collimated and/or focused. In such an embodiment, the wavelength-converting region 120 and the reflective thermally conductive region 130 are non-planar. For example, in the illustration of FIG. 4b, the assembly of the wavelength-converting region and the thermally conductive region has a parabolic shape, but it should be appreciated that any other suitable shape may be used. The light-generating region 110 may be configured so as to generate light that is projected onto the wavelength-converting region. Some of the light can be converted by the wavelength-converting region, and both converted light propagating towards the reflecting thermally conductive region and any unconverted light can be reflected and directed away from the light-emitting device 400b.

The reflecting non-planar surface of the thermally conductive region 130 can serve to collimate and/or focus the emitted light. For example, collimation and/or focusing may be enhanced by the use of a parabolic reflective surface. Furthermore, the light-generating region 110 may be located at the focal point of the parabolic reflective surface, and as a result, the light emitted by the light-emitting device may be highly collimated and/or focused.

In other embodiments, a collection optic (not shown) may be placed in the vicinity of the parabolic mirror's focal point, and may facilitate focusing and/or collimation of light prior to emission from the light-emitting device. The collection optic may comprise any suitable optical components that may facilitate collimation and/or focusing; for example, the collection optic may comprise any suitable lens or collection of lens.

Figure 5:
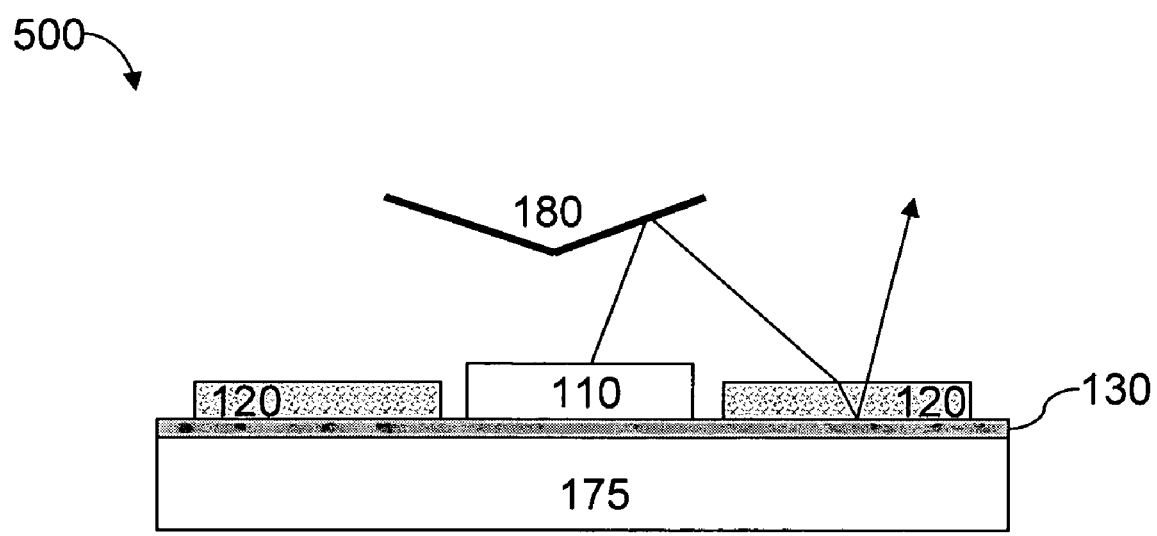
FIG. 5 is a schematic of a light-emitting device where a reflective surface is configured to reflect light generated by a light-generating region toward one or more wavelength-converting region(s) in accordance with one embodiment of the invention.

FIG. 5 illustrates a light-emitting device 500 in accordance with another embodiment of the invention. In this embodiment, a reflective surface 180 is configured to reflect light generated by light-generating region 110 toward one or more wavelength-converting region(s) 120. In some embodiments, as shown in FIG. 5, the light-generating region and the wavelength-converting region(s) can be in contact with a common thermally conductive region 130 which can be disposed over a support 175. The support may comprise a growth substrate, a sub-mount, a package substrate, and/or any other suitable structure that supports the thermally conductive region 130. The support may also be thermally conductive and can be further placed in contact with a heat sink (not shown) thereby enabling the conduction of heat generated in regions 120 and/or 110 to the thermally conductive region 130, then through support 175, and into the heat sink.

In other embodiments, the light-generating region and the wavelength-converting region need not share the same thermally conductive region, but rather may be in thermal contact with separate thermally conductive regions. The thermally conductive region 130 may facilitate the extraction of heat from the light-generating region and/or the wavelength-converting region(s). Furthermore, the thermally conductive region 130 may also comprise a reflecting surface that can reflect light generated by the light-generating region and/or emitted by the wavelength-converting region(s).

Figure 6:
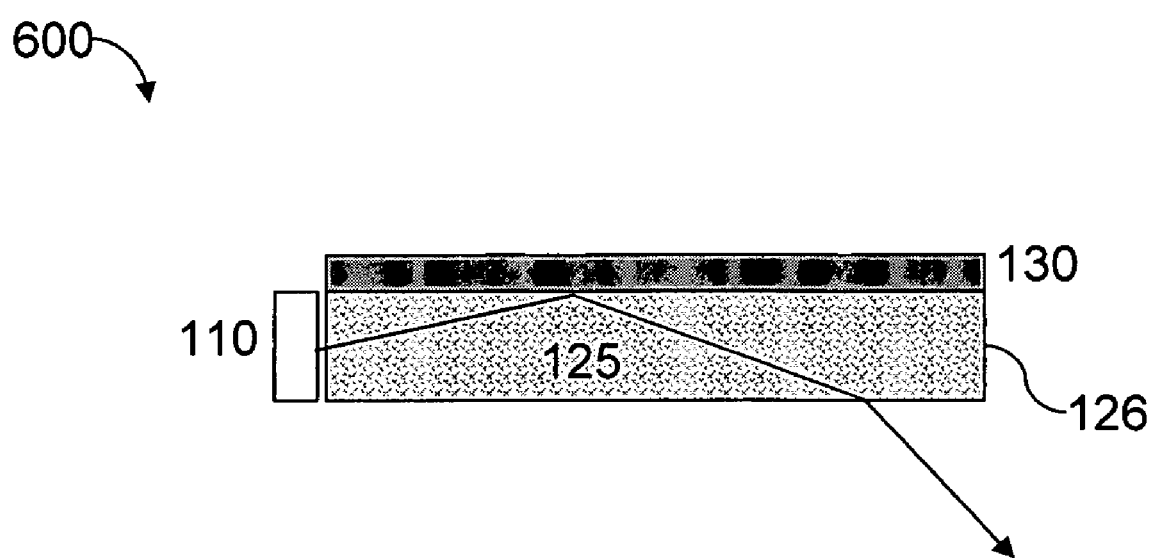
FIG. 6 is a schematic of a light-emitting device where a light pipe can include a wavelength-converting region in accordance with one embodiment of the invention.

FIG. 6 illustrates a light-emitting device 600 in accordance with another embodiment of the invention. In the illustrated embodiment, a light pipe 125 can include a wavelength-converting region which may be localized to specific regions within the light pipe or may extend throughout the light pipe. In another embodiment, a wavelength-converting region may be disposed along the emission surface of the light pipe 125; for example, a wavelength-converting layer may be located on the emission surface of the light pipe. The light-generating region 110 can be configured to generate light that propagates into the light pipe. A reflective thermally conductive region 130 can partially or completely contact one or more sidewalls of the light pipe. Additionally, the light pipe may also include cooling channels to enable the flow of fluid.

During operation of light-emitting device 600, light generated by region 110 can propagate within the light-pipe and be reflected by the reflective thermally conductive region 130. Light from region 110 may also be converted by the wavelength-converting region located within or on the light pipe, thereby emitting converted light.

In one embodiment, the reflective thermally conductive region may completely surround the sidewalls of the light pipe and thereby ensure that all light is emitted at side 126 of the light pipe. In such configurations, light generated by region 110 traverses the entire length of the light pipe, and therefore may have ample opportunity to be converted by the wavelength-converting region within the light pipe. The length of the light pipe may be tailored to convert a desired portion of the light emitted by the light-generating region so that the combined converted and unconverted light emitted by the light-emitting device 600 possess a desired wavelength spectrum.

In other embodiments, the light pipe 125 may posses a length (e.g., greater than about 1 cm, greater than about 3 cm, greater than about 5 cm, or greater than about 10 cm) such that the surface area of the light pipe can provide substantial cooling via contact with the surrounding atmosphere, without the use of a thermally conductive region. In such cases, a reflecting surface may still be present on one or more sides of the light pipe, but the reflecting surface need necessarily be part of a thermally conductive region. In other embodiments, the wavelength-converting region is incorporated into objects having any other shape. For example, a wavelength-converting region may be incorporated within and/or on a light diffusion panel or a globe.

Figure 7:
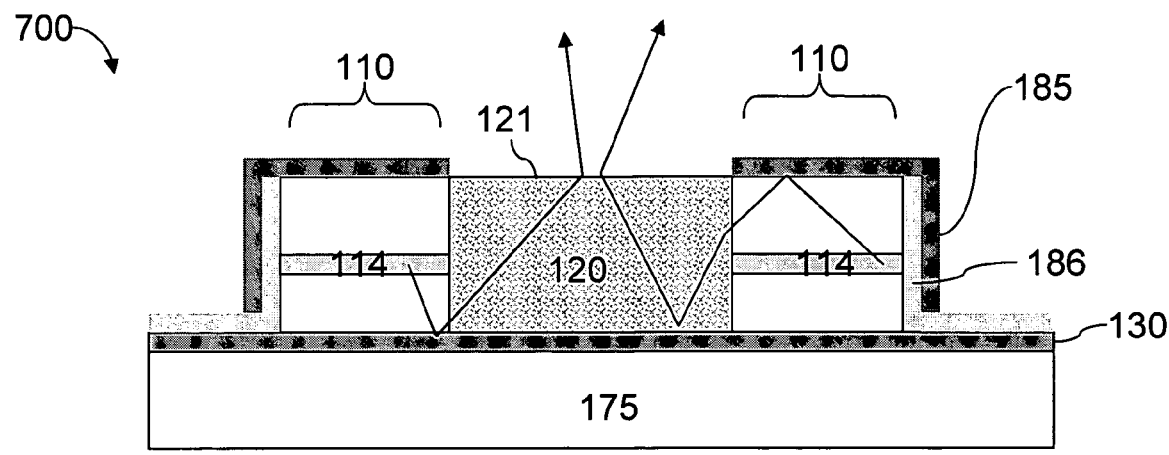
FIG. 7 is a schematic of a light-emitting device where a wavelength-converting region is arranged alongside side-walls of one or more light-generating regions in accordance with one embodiment of the invention.

FIG. 7 illustrates another embodiment of a light-emitting device 700 where the sidewalls of the wavelength-converting region 120 are arranged alongside the sidewalls of one or more light-generating regions 110. In this illustrative embodiment, light-generating regions 110 are LEDs that include active regions 114. In some embodiments, insulating layers 186 may insulate one or more sides of the LEDs. Reflective layers 185 are formed on the top surface and outer sidewalls of the LEDs, whereas the inner sidewalls of the LEDs face the wavelength-converting region. The reflecting layers may be formed of a conductive material, and therefore can also serve as contact pads on the top surface of the LEDs; in such a case, insulating layers 186 ensure that the LED sidewalls are electrically insulated from the conductive reflective layers 185. A thermally conductive region 130 may be placed in thermal contact with the LEDs and the wavelength-converting region, and the thermally conductive region may be disposed over a support 175. Furthermore, the thermally conductive region may also include a reflective surface that can reflect impinging light.

During operation of the LEDs, any light generated by the active regions 114 which is not emitted directly into the wavelength-converting region 120 can be reflected into the wavelength-converting region by reflective layers 185 and/or the reflective surface of the thermally conductive region 130. Once within the wavelength-converting region, some or all of the light may be converted by wavelength-converting material and, therefore, light emitted at surface 121 of the wavelength-converting region may include both converted and unconverted light. Heat generated by the wavelength-converting region and/or the LEDs may be extracted by the thermally conductive region, thereby facilitating operation at high power levels. The thermally conductive region may in turn be in thermal contact with a heat sink (not shown). Additionally or alternatively, the support 175 may also be thermally conductive and can be placed in contact with a heat sink (not shown) thereby enabling the conduction of heat generated in wavelength-converting region 120 and/or LEDs 110 to the thermally conductive region 130, then through support 175, and into the heat sink.

Figure 8:
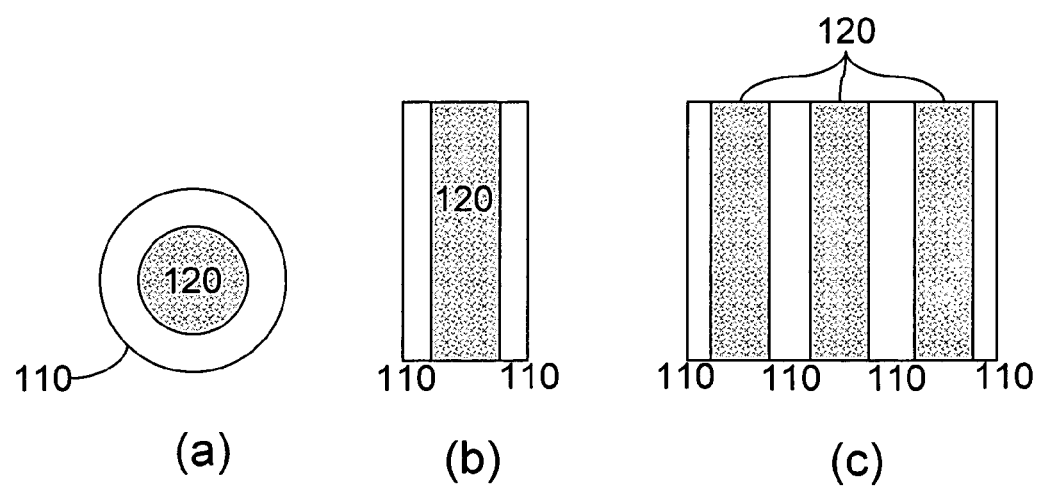
FIGS. 8a–c are top views of the light-emitting device of FIG. 7 in accordance with some embodiments of the invention.

FIGS. 8*a–c* illustrate top views of various embodiments of light-emitting device 700. In FIG. 8*a*, the wavelength-converting region 120 is surrounded by the light-generating region 110. In FIG. 8*b*, light-generating regions are formed on two or more sides of the wavelength-converting-region but do not surround the entire light-generating regions. In FIG. 8*c*, multiple wavelength-converting regions and light-generating regions form an alternating array of wavelength-converting regions and light-generating regions.

Figure 9:
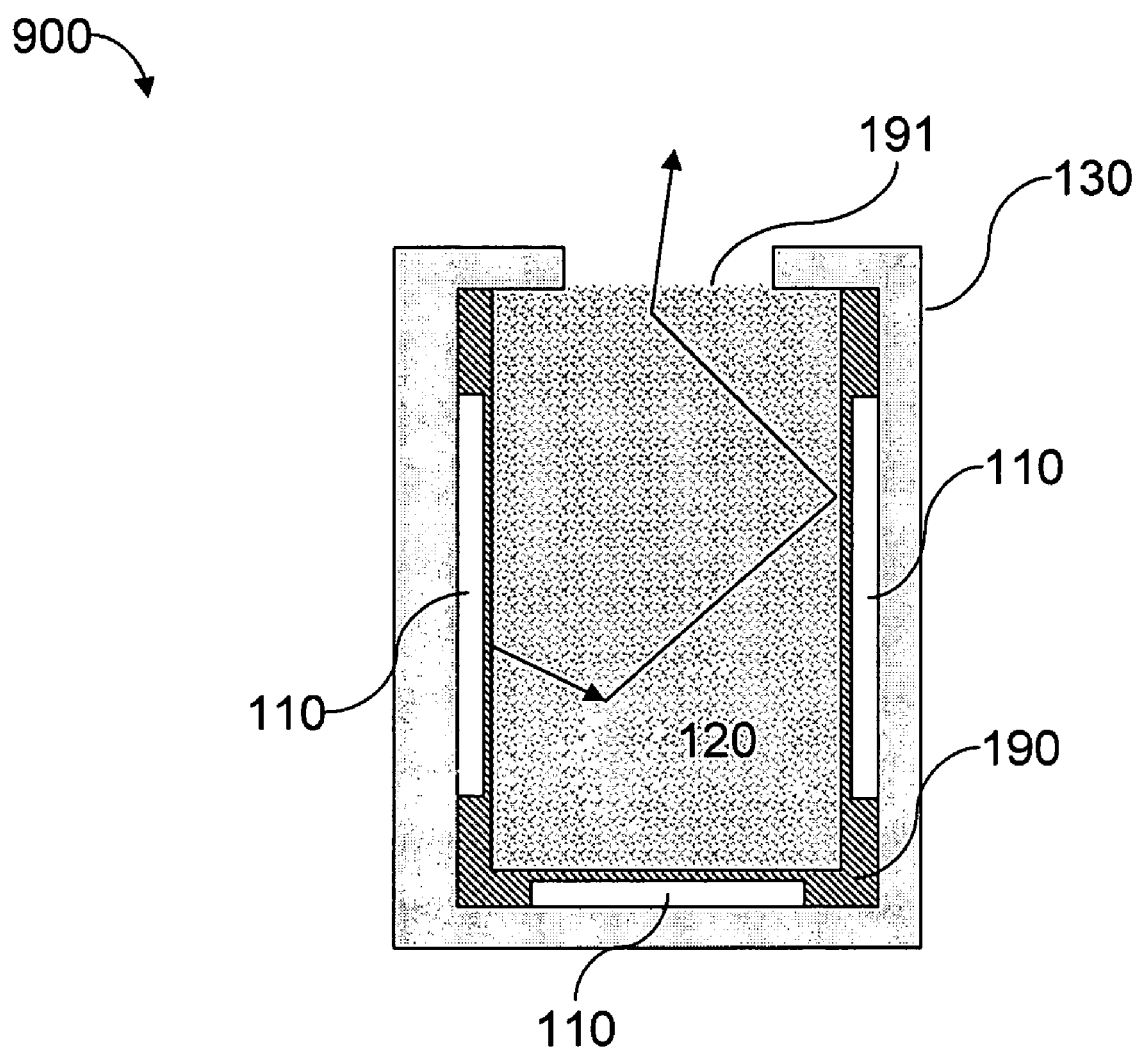
FIG. 9 is a schematic of a light-emitting device including a cavity in accordance with one embodiment of the invention.

FIG. 9 illustrates a light-emitting device 900 in accordance with another embodiment of the invention. In this embodiment, a cavity with an opening 191 is formed by cavity walls 190, and the cavity may be partially or completely filled with a wavelength-converting region 120. One or more light-generating regions 110 (e.g., LEDs) are arranged to emit light into the cavity. Light-generating regions are positioned within the cavity walls, outside the cavity walls and/or embedded within the walls. A thermally conductive region 130 surrounds the cavity so that at least a portion of the light-generating regions and the wavelength-converting region are in thermal contact with the thermally conductive region. In other embodiments, heat extraction and/or conduction from the wavelength-converting region can also be provided by conductive poles and/or tubes embedded within the wavelength-converting region.

During operation of the light-emitting device 900, light-generating regions 110 emit light into wavelength-converting region 120. The generated light can be converted by the wavelength-converting region and the converted light can reflect off the cavity walls 190. The cavity walls may be configured to allow transmission of unconverted light, but reflect converted light (e.g., dichroic walls). Light can exit the cavity via opening 191. Thermal management and operation at high powers and brightness of emitted light can be enabled as a result of the thermally conductive region 130 which surrounds the cavity and is in thermal contact with the light-generating regions and the wavelength-converting region. Additionally or alternatively, the thermally conductive region includes channels for fluid flow. In additional embodiments, thermally conductive material can be incorporated within the wavelength-converting region (e.g., metallic rods, carbon nanotubes)

In another embodiment, the wavelength-converting region is designed to minimize re-absorption of converted light. For example, this can be accomplished by layering a wavelength-converting material in accordance with known absorption and emission properties of the wavelength-converting material. For example, a multilayer wavelength-converting region can include several wavelength-converting layers, each which emits light at a different wavelength. In order to optimize the multilayer structure, the layer order from bottom to top can be chosen so that light emitted by lower layers is not substantially reabsorbed by upper layers. In other embodiments, light channels can be incorporated into the wavelength-converting region. For example, one or more light channels, that do not include wavelength-converting material, may be formed so as to extend from the opening 191 into the wavelength-converting region 120. The light channels may be empty or may be filled with a material that has a suitable index of refraction.

In some embodiments, the cavity is not filled with a wavelength-converting region, but rather the wavelength-converting region is located at the opening of the cavity. For example, the wavelength-converting region may be incorporated into a window located at the opening of the cavity.

In some embodiments, the sides of the cavity are tapered or patterned so as to direct light out of the cavity opening. It should also be appreciated that the cavity may have any shape, and may also include more than one openings, as the invention is not limited so.

Figure 10:
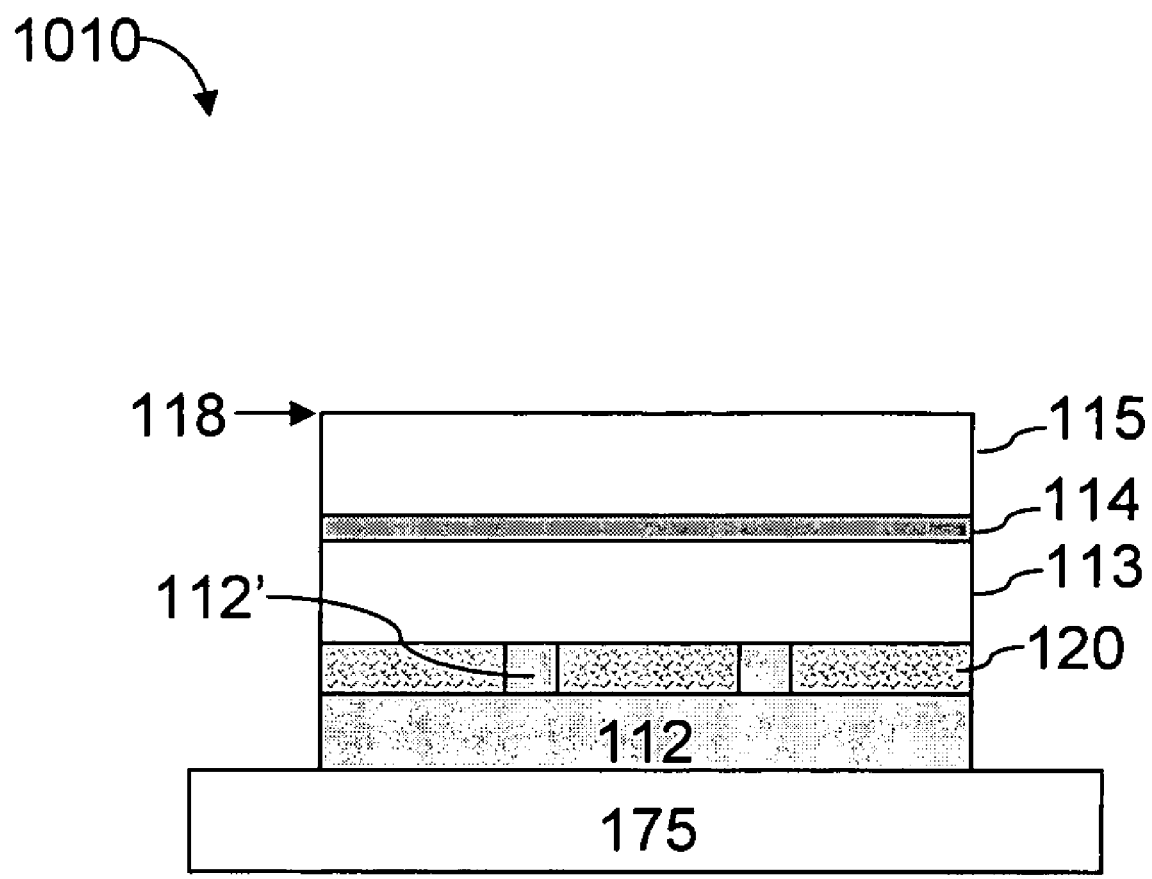
FIG. 10 is a schematic of a multi-layer stack of an LED that includes a wavelength-converting region in accordance with one embodiment of the invention.

FIG. 10 illustrates an embodiment of a multi-layer stack of an LED 1010 that includes a wavelength-converting region. In some embodiments, wavelength-converting region 120 can be incorporated between the active region 114 and a reflective layer 112 formed over a support 175. Reflective layer 112 can also be electrically conductive and therefore can serve as an electrical contact for the LED. Furthermore, reflective layer 112 can serve as a thermally conductive region and therefore aid in the extraction of heat from the wavelength-converting region. Additionally, support 175 may also be thermally conductive and can be placed in contact with a heat sink (not shown) thereby enabling the conduction of heat generated in wavelength-converting region 120, through the reflective layer 112, then through support 175, and into the heat sink.

The wavelength-converting region may be patterned so as to enable current injection (and thermal conduction) to the LED multi-layer stack through conductive regions 112'. The LED can additionally, or alternatively, include a current spreading layer (e.g., a transparent metal or a metal oxide) at or near the interface between the wavelength-converting region and doped layer 113 of the LED multi-layer stack.

During operation of the LED 1010, unconverted light from the active region can escape the multi-layer stack via emitting surface 118. Additionally, light from the active region can also be absorbed by the wavelength-converting region and converted to light of another wavelength. Reflecting layer 112 can facilitate directing converted light toward the emission surface 118, and can also serve as a thermally conductive region in thermal contact with the wavelength-converting region and/or the remainder of the LED multi-layer stack (via conductive region 112').

Figure 11:
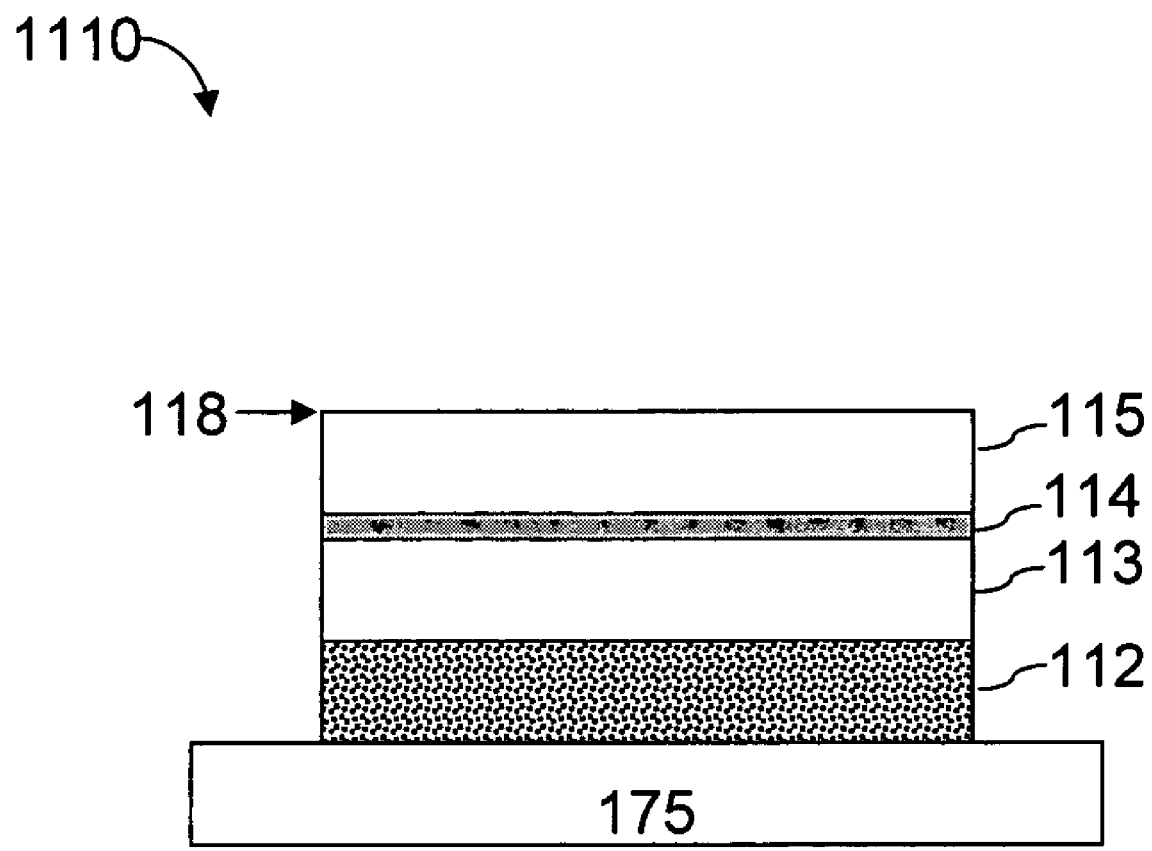
FIG. 11 is a schematic of a multi-layer stack of an LED including a wavelength-converting region incorporated into an electrically and/or thermally conductive layer in accordance with one embodiment of the invention.

FIG. 11 illustrates an embodiment of an LED 1010 in accordance with an embodiment of the invention. In this embodiment, a wavelength-converting region is incorporated into an electrically and/or thermally conductive layer of the LED multi-layer stack. In the illustration of FIG. 11, wavelength-converting material is incorporated into an electrically and/or thermally conductive layer 112 disposed between the doped layer 113 and the support 175. Layer 112 may be formed of conductive silver epoxy incorporating wavelength-converting material (e.g., phosphorus particles, nanodots) within, but it should be understood that this is just one example of an electrically and/or thermally conductive layer having a wavelength-converting region within, and other embodiments are possible.

Layer 112 may serve multiple functions, including converting light emitted by the active layer 114 via the wavelength-converting material present therein. Furthermore, layer 112 may also serve as an electrically conductive region that enables current to be injected into the doped layer 113 of the LED. Moreover, layer 112 may also serve as a thermally conductive region for the wavelength-converting material therein and/or the remaining LED multi-layer stack.

In some embodiments of the invention, wavelength-converting materials can be incorporated into larger objects (e.g., panels, 3-dimensional objects) by mixing wavelength-converting materials with a porous material (e.g., foam based materials, porous silica, aerogel). The wavelength-converting material can be excited remotely using incident light (e.g., using LEDs or lasers) or internally by embedded light-generating regions (e.g., LEDs or lasers). When operated at high brightness, heat extraction may be facilitated by the porous nature of the above-mentioned materials which can provide self-cooling. The cooling process is a result of the substantially large amount of surface area between the porous material and the surrounding atmosphere, as compared to a non-porous material. In the case of non-porous, large area, wavelength-converting structures, a heat sink in thermal contact with the structures can be employed to facilitate operation at high power and brightness of the emitted light.

It should be appreciated that the light-emitting devices and structures described in the above embodiments can be fabricated using a combination of any suitable processing techniques. Such processes can include thin film deposition techniques, such as chemical vapor deposition, for depositing various materials, including semiconductors, insulators, and metals. Evaporation and sputtering can be utilized to deposit metals. Patterning processes, such as photo-lithography and nano-imprint techniques, may be used to form patterning masks. Etching processes, such as dry etching (e.g., reactive ion etching), and wet etching, may be used to pattern layers. Coating and spin-coating can be used to deposit encapsulants and wavelength-converting regions, such as wavelength-converting materials (e.g., phosphor particles, nanodots) suspended in a secondary material (e.g., epoxy). Alternatively or additionally, injection molding can also be used to form wavelength-converting regions. Wafer bonding processes may be used to transfer structures and devices. Furthermore, packaging processes may be used to package the aforementioned light-emitting devices and structures.

During operation, the thermally conductive region can conduct heat away from the wavelength-converting region (and, in some cases, also the light-generating region). This enables the light-emitting devices to operate at the high power levels. For example, the light-emitting device may emit light having a total power greater than 0.5 Watts, greater than 1 Watt, greater than 5 Watts, or greater than 10 Watts. In some cases, the light emitted by the device has a total power of less than 100 Watts, though this should not be construed as a limitation of all embodiments of the invention. The desired power depends, in part, on the application. These high powers may be maintained for long operating lifetimes, in part, due to conduction of the heat away from the wavelength-converting region by the thermally conductive region. As used herein, "operating lifetime" refers to the length of time a device can maintain light emission having at least 50% of the total power of the initial light emission from the device). In some embodiments, the operating lifetimes may be greater than 2,000 hours (e.g., greater than 5,000 hours, greater than 10,000 hours, and greater than 20,000 hours).

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A light-emitting device comprising:
   a light-generating region adapted to generate light;
   a wavelength-converting region capable of absorbing light generated by the light-generating region and emitting light having a different wavelength than a wavelength of the light generated by the light-generating region; and
   a thermally conductive region in contact with the wavelength-converting region and capable of conducting heat generated in the wavelength-converting region, the thermally conductive region comprising a material having a thermal conductivity greater than a thermal conductivity of the wavelength-converting region, wherein the light-emitting device is adapted to emit light having a total power of greater than 0.5 Watts.

2. The device of claim 1, wherein the thermally conductive region is in contact with a heat sink.

3. The device of claim 2, wherein the heat sink is external of the light-emitting device.

4. The device of claim 1, wherein the thermally conductive region comprises a heat sink.

5. The device of claim 1, further comprising a package including a window, the window comprising the wavelength-converting region.

6. The device of claim 5, wherein the package includes a frame surrounding a portion of the window, the frame comprising the thermally conductive region.

7. The device of claim 5, wherein the window comprises the thermally conductive region.

8. The device of claim 1, wherein the thermally conductive region comprises a layer adjacent to the wavelength-converting region.

9. The device of claim 1, wherein the thermally conductive region comprises a layer adjacent to the wavelength-converting region, the layer being substantially reflective of light emitted from the wavelength-converting region.

10. The device of claim 1, wherein the thermally conductive region comprises a patterned region adjacent to the wavelength-converting region.

11. The device of claim 1, wherein the thermally conductive region is embedded within the wavelength-converting region.

12. The device of claim 11, wherein the thermally conductive region comprises an elongated structure embedded within the wavelength-converting region.

13. The device of claim 1, further comprising a filter constructed and arranged to allow light having at least one selected wavelength to pass therethrough and to reflect light having at least one non-selected wavelength.

14. The device of claim 1, wherein the wavelength-converting region and the light-generating region are portions of a first structure.

15. The device of claim 1, wherein the wavelength-converting region is a portion of a first structure and the light-generating region is a portion of a second structure physically separated from the first structure.

16. The device of claim 15, wherein the wavelength-converting region is formed on a reflective region.

17. The device of claim 1, further comprising a reflective region constructed and arranged to direct light generated by the light-generating region toward the wavelength-converting region.

18. The device of claim 17, wherein the light-generating region is formed over a first portion of a support and the wavelength-converting region is formed over a second portion of the support.

19. The device of claim 18, wherein the thermally conductive region comprises a layer formed on the support and is in contact with the light-generating region and the wavelength-converting region.

20. The device of claim 1, further comprising a light pipe, wherein the light pipe comprises the wavelength-converting region.

21. The device of claim 1, further comprising a light pipe, wherein the wavelength-converting region is formed on the light pipe.

22. The device of claim 1, wherein at least a sidewall of the wavelength-converting region is in contact with the light-generating region.

23. The device of claim 1, wherein the light-generating region surrounds sidewalls of the wavelength-converting region.

24. The device of claim 1, wherein the device further comprises a second light-generating region adapted to emit light.

25. The device of claim 24, wherein the light-generating region is a portion of a first LED and the second light-generating region is a portion of a second LED.

26. The device of claim 25, wherein the device comprises an array of LEDs including at least the first LED and the second LED, wherein the first LED and the second LED are adapted to emit light and the total power of the emitted light from each of the first LED and the second LED is greater than 0.5 Watts.

27. The device of claim 1, wherein the light-generating region is a portion of a first LED and the first LED is adapted to emit light having a total power of greater than 0.5 Watts.

28. The device of claim 1, further comprising a structure defining a cavity, wherein the wavelength-converting region is formed in the cavity and the light-generating region is adapted to emit light into the cavity.

29. The device of claim 28, wherein the light-generating region is formed on a wall of the structure defining the cavity and the wall comprises the thermally conductive region.

30. The device of claim 1, wherein the light-generating region comprises a semiconductor region.

31. The device of claim 30, wherein the semiconductor region comprises a III–V compound.

32. The device of claim 1, wherein the light-generating region is an LED.

33. The device of claim 1, wherein the wavelength-converting region comprises phosphor material particles dispersed in a second material.

34. The device of claim 1, wherein the wavelength-converting region comprises nanodots.

35. The device of claim 1, wherein the light emitted by the wavelength-converting region has a total power flux of greater than 3 mWatts/mm$^2$.

36. The device of claim 1, wherein the light emitted by the wavelength-converting region has a total power density of greater than 1.5 mWatts/mm$^3$, where the total power density is a total power flux per thickness of the wavelength-converting region.

37. The device of claim 1, wherein the light emitted by the light-emitting device has a total power of greater than 1 Watt.

38. The device of claim 1, wherein the light emitted by the light-emitting device has a total power of greater than 5 Watts.

39. The device of claim 1, wherein the light emitted by the light-emitting device has a total power of between 0.5 Watts and 20 Watts.

40. The device of claim 1, wherein the region adapted to emit light comprises an emitting surface having a dielectric function that varies spatially.

41. The device of claim 40, wherein the dielectric function varies spatially according to a pattern.

42. The device of claim 41, wherein the pattern is periodic.

43. The device of claim 42, wherein the pattern is complex periodic.

44. The device of claim 41, wherein the pattern is non-periodic.

45. The device of claim 41, wherein the pattern is a quasi-crystal pattern.

46. A light-emitting device comprising:

a light-generating region adapted to generate light;

a wavelength-converting region capable of absorbing light generated by the light-generating region having a total power of greater than 0.5 Watts and emitting light having a different wavelength than a wavelength of the light generated by the light-generating region; and a thermally conductive region in contact with the wavelength-converting region and capable of conducting heat generated in the wavelength-converting region, the thermally conductive region comprising a material having a thermal conductivity greater than a thermal conductivity of the wavelength-converting region.

47. The device of claim 46, wherein the thermally conductive region is in contact with a heat sink.

48. The device of claim 46, wherein the semiconductor region is a portion of an LED.

49. The device of claim 48, wherein the light emitted by the LED has a total power flux of greater than 0.03 Watts/mm$^2$.

50. The device of claim 46, wherein the semiconductor region comprises an emitting surface having a dielectric function that varies spatially.

51. The device of claim 46, wherein the device further comprises a second light-generating region adapted to emit light.

52. The device of claim 51, wherein the light-generating region is a portion of a first LED and the second light-generating region is a portion of a second LED.

53. The device of claim 52, wherein the device comprises an array of LEDs including at least the first LED and the second LED, wherein the first LED and the second LED are adapted to emit light, each having a total power of greater than 0.5 Watts.

54. The device of claim 46, wherein the wavelength-converting region comprises phosphor material particles dispersed in a second material.

55. A method of operating a light-emitting device comprising:

generating light in a light-generating region of an LED having a total power of greater than 0.5 Watts;

absorbing light generated by the light-generating region in a wavelength-converting region and emitting light having a wavelength different than a wavelength of the light generated in the light-generating region; and emitting light from the light-emitting device, wherein the device has an operating lifetime of greater than 2,000 hours.

56. The method of claim 55, further comprising conducting heat generated in the wavelength-converting region in a thermally conductive region comprising a material having a thermal conductivity greater than a thermal conductivity of the wavelength-converting region.

57. The method of claim 55, wherein the device has an operating lifetime of greater than 10,000 hours.

58. The method of claim 51, wherein the total power flux emitted by the LED is greater than 0.03 Watts/mm$^2$.

59. A method of forming a light-emitting device, the method comprising:

forming a light-generating region adapted to generate light;

forming a wavelength-converting region capable of absorbing light generated by the light-generating region and emitting light having a different wavelength than a wavelength of the light generated by the light-generating region; and forming a thermally conductive region in contact with the wavelength-converting region and capable of conducting heat generated in the wavelength-converting region, the thermally conductive region comprising a material having a thermal conductivity greater than a thermal conductivity of the wavelength-converting region, wherein the light-emitting device is adapted to emit light having a total power of greater than 0.5 Watts.

60. The method of claim 59, further comprising providing a heat sink connectable to the thermally conductive region.

* * * * *

UNITED STATES PATENT AND TRADEMARK OFFICE
CERTIFICATE OF CORRECTION

PATENT NO. : 7,196,354 B1  Page 1 of 1
APPLICATION NO. : 11/238667
DATED : March 27, 2007
INVENTOR(S) : Alexei A. Erchak et al.

It is certified that error appears in the above-identified patent and that said Letters Patent is hereby corrected as shown below:

Column 6, line 6, "1119" should be --119--; and

Column 9, line 35, "10 mm" should be --10 $mm^2$--.

Signed and Sealed this

Twenty-sixth Day of June, 2007

JON W. DUDAS
*Director of the United States Patent and Trademark Office*